US010677836B2

(12) United States Patent
Dobrinsky et al.

(10) Patent No.: US 10,677,836 B2
(45) Date of Patent: Jun. 9, 2020

(54) OPTOELECTRONIC DEVICE WITH SEMICONDUCTOR HETEROSTRUCTURE AND STRESS CONTROLLING STRUCTURE TO EXERT STRESS ONTO LAYERS OF THE HETEROSTRUCTURE

(71) Applicant: Sensor Electronic Technology, Inc., Columbia, SC (US)

(72) Inventors: Alexander Dobrinsky, Silver Spring, MD (US); Michael Shur, Vienna, VA (US)

(73) Assignee: Sensor Electronic Technology, Inc., Columbia, SC (US)

( * ) Notice: Subject to any disclaimer, the term of this patent is extended or adjusted under 35 U.S.C. 154(b) by 112 days.

(21) Appl. No.: 15/857,805

(22) Filed: Dec. 29, 2017

(65) Prior Publication Data

US 2018/0188315 A1  Jul. 5, 2018

Related U.S. Application Data

(60) Provisional application No. 62/440,001, filed on Dec. 29, 2016.

(51) Int. Cl.
| | |
|---|---|
| *G01R 31/26* | (2020.01) |
| *H01L 33/00* | (2010.01) |
| *H01L 33/06* | (2010.01) |
| *H01L 33/12* | (2010.01) |
| *G01R 1/04* | (2006.01) |

(Continued)

(52) U.S. Cl.
CPC ....... *G01R 31/2635* (2013.01); *G01R 1/0408* (2013.01); *G01R 31/003* (2013.01); *H01L 33/0025* (2013.01); *H01L 33/0079* (2013.01); *H01L 33/06* (2013.01); *H01L 33/12* (2013.01); *H01L 33/145* (2013.01); *H01L 33/405* (2013.01); *H01L 33/46* (2013.01); *H01L 33/32* (2013.01); *H01L 2933/0033* (2013.01)

(58) Field of Classification Search
CPC ............... G01R 1/0408; G01R 31/003; G01R 31/2635; H01L 2933/0033; H01L 33/0025; H01L 33/0079; H01L 33/06; H01L 33/12; H01L 33/145; H01L 33/32; H01L 33/405; H01L 33/46; H01L 33/20; H01L 33/007; H01L 33/0075; H01L 33/16; H01L 33/22; H01L 33/385
See application file for complete search history.

(56) References Cited

U.S. PATENT DOCUMENTS

| | | | |
|---|---|---|---|
| 9,537,054 B2 * | 1/2017 | Billingsley | ............. H01L 33/32 |
| 9,653,631 B2 * | 5/2017 | Jain | ................. H01L 31/035272 |

(Continued)

*Primary Examiner* — Vinh P Nguyen
(74) *Attorney, Agent, or Firm* — LaBatt, LLC

(57) ABSTRACT

An optoelectronic device with at least one stress controlling structure and method of testing the device is disclosed. The optoelectronic device includes a stress controlling structure formed adjacent to a semiconductor heterostructure. The optoelectronic device can further include a stress inducing component that is configured to induce a change in stress within the stress controlling structure. The stress inducing component can induce a number of different stresses during a test of the optoelectronic device. A strain evaluator can evaluate the stresses within the semiconductor heterostructure as a function of a strain generated in the stress controlling structure.

20 Claims, 16 Drawing Sheets

(51) Int. Cl.
    *H01L 33/40*       (2010.01)
    *H01L 33/46*       (2010.01)
    *G01R 31/00*       (2006.01)
    *H01L 33/14*       (2010.01)
    *H01L 33/32*       (2010.01)

(56) References Cited

U.S. PATENT DOCUMENTS

2015/0295127 A1   10/2015   Shur et al.
2016/0359081 A1   12/2016   Shur et al.
2017/0352776 A1   12/2017   Shur et al.

\* cited by examiner

OPTOELECTRONIC DEVICE WITH SEMICONDUCTOR HETEROSTRUCTURE AND STRESS CONTROLLING STRUCTURE TO EXERT STRESS ONTO LAYERS OF THE HETEROSTRUCTURE

REFERENCE TO RELATED APPLICATIONS

The present patent application claims the benefit of U.S. Provisional Application No. 62/440,001, filed on 29 Dec. 2016, which is hereby incorporated by reference in its entirety to provide continuity of disclosure.

TECHNICAL FIELD

The disclosure relates generally to semiconductor-based devices, and more particularly, to devices formed from semiconductor heterostructures and use of a stress control structure for evaluating performance and/or reliability of the devices.

BACKGROUND ART

Semiconductor-based optoelectronic devices, such as semiconductor emitting and sensing devices, include light emitting diodes (LEDs) composed of group III-V semiconductors. Ultraviolet (UV) LEDs based on group III nitride semiconductor layers are a subset of LEDs composed of group III-V semiconductors. The performance and reliability of UV LED devices based on group III nitride semiconductor layers are dependent on many factors. The efficiency of these devices is one factor that has a role in the performance and reliability of the device. Typically, the efficiency of UV LEDs based on group III nitride semiconductor layers can be increased by minimizing dislocation density and a number of cracks in the semiconductor layers. Approaches to minimizing the dislocation density and the number of cracks in these UV LED devices have sought to grow low-defect semiconductor layers on patterned substrates. These substrate patterning approaches typically rely on reducing stresses present in epitaxially grown semiconductor layers. While substrate patterning is a common route to achieving higher quality epitaxial layers, this approach is expensive for production of UV LEDs in large quantities, and does not necessary translate into improvements in performance and reliability.

SUMMARY OF THE INVENTION

This Summary Of The Invention introduces a selection of certain concepts in a brief form that are further described below in the Detailed Description Of The Invention. It is not intended to exclusively identify key features or essential features of the claimed subject matter set forth in the Claims, nor is it intended as an aid in determining the scope of the claimed subject matter.

Aspects of the present invention are directed to evaluating and/or improving device performance and/or extending device operational lifetime through the use of a stress control structure described herein. In addition, the stress control structure can allow for tuning the device emission/absorption wavelength. The stress control structure can be utilized to exert stresses onto other layers of the semiconductor structure, which can result in wavelength tuning and the device operating under stress, which can be beneficial for device testing.

In one embodiment, the stress control structure can take the form of a stress controlling substrate that imparts a target stress or strain in the semiconductor heterostructure. For example, the stress controlling substrate can replace a substrate used to epitaxially grow the semiconductor layers of the semiconductor heterostructure. The stress controlling substrate can be attached to the semiconductor heterostructure through one of a multitude of approaches such as soldering. In one embodiment, the stress controlling substrate can include a piezoelectric material, such as $LiNbO_3$, $LiTaO_3$, PZT, quartz, and/or the like. In one embodiment, the stress controlling substrate can include a laminate of layers with some of the layers having piezoelectric properties. In one embodiment, the stress controlling substrate can include a plurality of domains, with each of the domains having piezoelectric properties. In one embodiment, the stress controlling substrate can include a plurality of composite domains having temperature activated materials that are configured for Joule heating. In one embodiment, the stress controlling substrate can include a UV transparent substrate having piezoelectric material.

In one embodiment, the stress control structure can be implemented as one or more layers within the semiconductor heterostructure. For example, for a semiconductor heterostructure having an n-type contact semiconductor layer, a p-type contact semiconductor layer, an active layer located between the n-type contact semiconductor layer and the p-type contact semiconductor layer, an n-type metallic contact layer located over a portion of the n-type contact semiconductor layer, a p-type metallic contact layer located over a portion of the p-type contact semiconductor layer, an n-type electrode contacting the n-type metallic contact layer, and a p-type electrode contacting the p-type metallic contact layer, the stress controlling layer can be located over one of the n-type contact semiconductor layer or the p-type contact semiconductor layer. In one embodiment, the stress controlling layer can extend into vacancies located in the one of the n-type contact semiconductor layer or the p-type contact semiconductor layer to contact one of the n-type electrode or the p-type electrode.

In one embodiment, the stress control structure can be implemented adjacent to a buffer layer formed between the semiconductor heterostructure and the substrate in which the semiconductor layers of the heterostructure are epitaxially grown. For example, a stress controlling structure can be located between the substrate and the buffer layer. In one embodiment, the stress controlling structure can include a plurality of disjointed domains extending laterally across the buffer layer, with each of the disjointed domains separated from an adjacent disjointed domain by a portion of the buffer layer.

In one embodiment, the stress control structure can be implemented about the semiconductor heterostructure and the substrate and buffer layer. For example, the stress controlling structure can at least partially confine the semiconductor heterostructure and the substrate on all sides. In this manner, the stress controlling structure can exert a mechanical stress on the semiconductor heterostructure and the substrate in a vertical direction. In another embodiment, the stress controlling structure can at least partially confine the substrate and a portion of the semiconductor heterostructure. In this manner, the stress controlling structure can exert a mechanical stress on the substrate and the semiconductor heterostructure in a lateral direction.

In one embodiment, a stress controlling substrate can be used with both the substrate and the buffer layer, where the substrate is thinned so that a higher stress can be placed onto the subsequent semiconductor layers. In one embodiment, a window can be located on the topmost electrode of the semiconductor heterostructure positioned above the thinned substrate and the stress controlling substrate. To this extent, the optoelectronic device can be tested to assess the overall device performance over time including the stability that the stress controlling substrate provides to the semiconductor layers of the heterostructure in response to an applied stress. Alternatively, a window can be formed in the stress controlling substrate. In one embodiment, the window can be configured to receive a material that is subject for analysis by a target radiation emitted or absorbed by the optoelectronic device. To this extent, the absorbance and/or reflectance of the material in the window to a target radiation can be altered through an action of the stress controlling substrate in response to an applied stress.

A stress inducing component can be used to selectively induce a change in stress within the stress controlling structure. The stress inducing component can utilize a number of approaches that can induce a target stress or strain within the stress controlling structure. In one embodiment, the stress inducing component can apply a periodic stress to the stress controlling structure through a series of stress impulses, such that the periodic stress includes one of a compressive stress or a tensile stress. In one embodiment, the stress inducing component can use Joule heating to induce a thermal stress. For example, the stress inducing component can heat or cool the optoelectronic device to a predetermined thermal stress temperature. In one embodiment, the stress inducing component can pass an electric current into the stress controlling structure to produce heating therein. In another embodiment, the stress inducing component can irradiate the optoelectronic device with a target testing radiation. These various forms of stresses can be applied individually or used in combination to test the performance of the optoelectronic device. In particular, these forms of stress testing can be used to assess how the performance of the overall device over time is affected by any of these applied stresses, and more specifically, how the stress controlling structure affects the stability of the semiconductor layers of the heterostructure in response to the applied stresses.

In one embodiment, interdigitated electrodes can be used to distribute the stresses from the stress inducing component to the semiconductor heterostructure and the stress controlling structure in a uniform or non-uniform distribution. For example, interdigitated electrodes can be located on a stress controlling substrate. To this extent, the change in stress induced in the stress controlling substrate by the stress inducing component will be a function of the location, the position, the separation, and the orientation of the electrodes that form the set of interdigitated electrodes. In one embodiment, a plurality of sets of interdigitated electrodes can be located on the stress controlling substrate. In this manner, the change in stress induced in the stress controlling substrate by the plurality of sets of interdigitated electrodes and the stress inducing component will be a function of the location, the position, the separation, and the orientation of the electrodes that form each set of interdigitated electrodes. In one embodiment, the location, the position, the separation, and the orientation of the electrodes in the sets of interdigitated electrodes can be used to produce a non-uniform distribution of stress in a lateral direction. In one embodiment, the sets of interdigitated electrodes can be activated synchronously to produce a stress wave that propagates through the stress controlling substrate.

A first aspect of the invention provides an optoelectronic device, comprising: a stress controlling structure including one of: a piezoelectric material or a joule heating material; a semiconductor heterostructure located adjacent to the stress controlling structure, the semiconductor heterostructure including an n-type contact semiconductor layer, a p-type contact semiconductor layer, and an active layer located between the n-type contact semiconductor layer and the p-type contact semiconductor layer that is configured to generate or sense radiation at a target peak wavelength; and a stress inducing component that is configured to induce a change in stress within the stress controlling structure.

A second aspect of the invention provides a method, comprising: forming an optoelectronic device including a stress controlling substrate, a semiconductor heterostructure located on the stress controlling substrate, the semiconductor heterostructure including an n-type contact semiconductor layer, a p-type contact semiconductor layer, and an active layer located between the n-type contact semiconductor layer and the p-type contact semiconductor layer that is configured to generate or sense radiation at a target peak wavelength, and a stress inducing component that is configured to induce a change in stress within the stress controlling substrate; applying a stress to the stress controlling substrate with the stress inducing component; applying a bias to the optoelectronic device to turn on the device; measuring an amount of stress and stress relaxation in the optoelectronic device as operation of the device shifts to the target peak wavelength; and comparing the measured stress and stress relaxation values to nominal stress and stress relaxation values corresponding to a testing optoelectronic device operating without application of a stress to the stress controlling substrate.

A third aspect of the invention provides an optoelectronic device, comprising: a stress controlling substrate; a semiconductor heterostructure located on the stress controlling substrate, the semiconductor heterostructure including an n-type contact semiconductor layer, a p-type contact semiconductor layer, and an active layer located between the n-type contact semiconductor layer and the p-type contact semiconductor layer that is configured to generate or sense radiation at a target peak wavelength; a stress inducing component that is configured to generate a target strain in the stress controlling substrate, the stress inducing component controlling the target strain in a lateral direction and/or a vertical direction; and a strain evaluator configured to evaluate the target strain within the semiconductor heterostructure as a function of the target strain generated in the stress controlling substrate.

A fourth aspect of the invention provides a method, comprising: forming an optoelectronic device including a stress controlling substrate, a semiconductor heterostructure located on the stress controlling substrate, the semiconductor heterostructure including an n-type contact semiconductor layer, a p-type contact semiconductor layer, and an active layer located between the n-type contact semiconductor layer and the p-type contact semiconductor layer that is configured to generate or sense radiation at a target peak wavelength, and a stress inducing component that is configured to induce a change in stress within the stress controlling substrate; applying a periodic stress to the stress controlling substrate with the stress inducing component to induce a stress in the optoelectronic device, wherein the periodic stress includes one of a compressive stress or a tensile stress; turning on the optoelectronic device; measuring an amount of stress and stress relaxation in the optoelectronic device as operation of the device shifts to the target peak wavelength; and comparing the measured stress and stress relaxation values to nominal stress and stress relaxation values corresponding to a nominal optoelectronic device operating without application of a periodic stress.

The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the invention taken in conjunction with the accompanying drawings that depict various aspects of the invention.

It is noted that the drawings may not be to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

Figure 1:
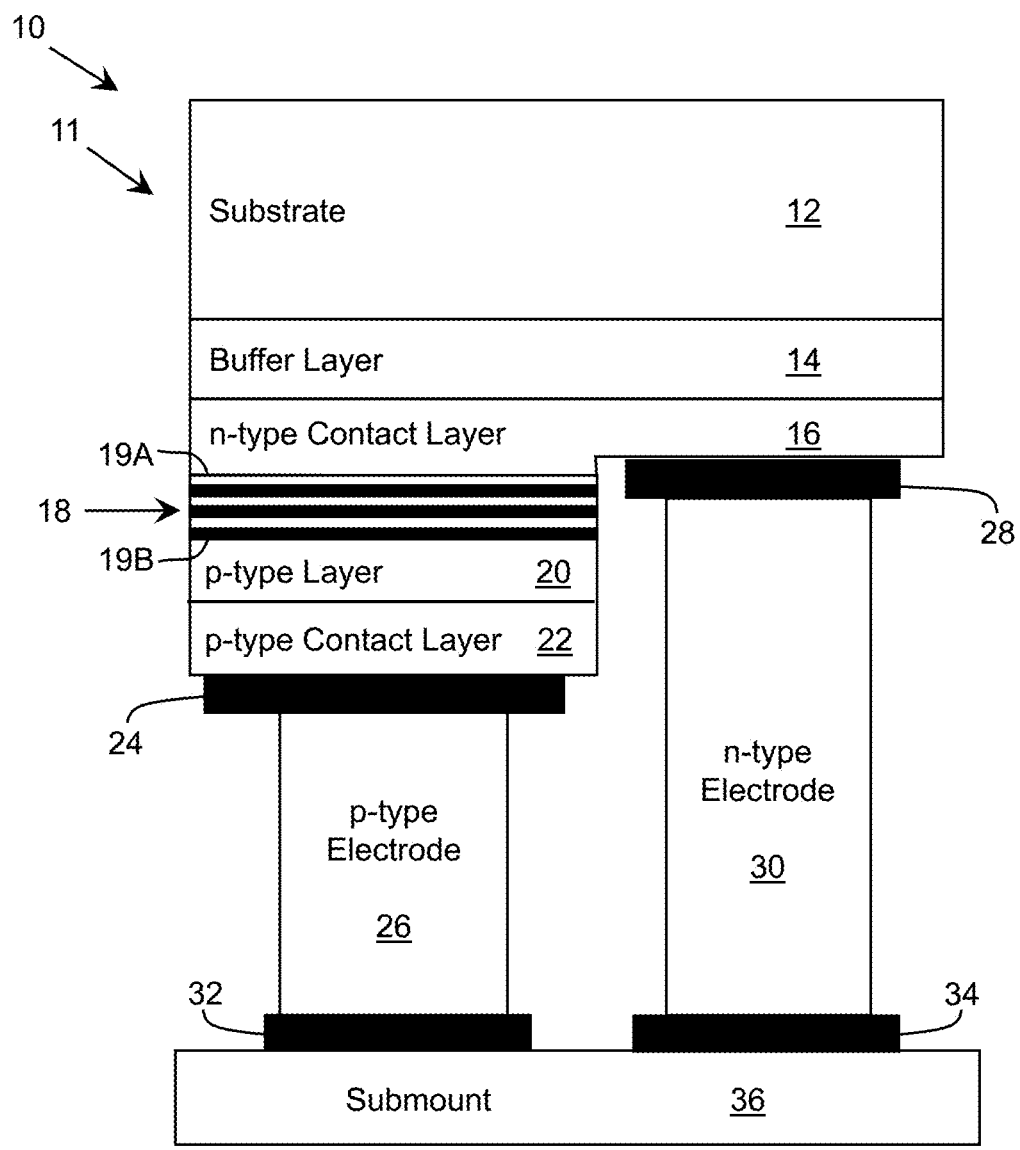
FIG. 1 shows a schematic of an illustrative optoelectronic device having a semiconductor heterostructure according to an embodiment.

As indicated above, aspects of the present invention are directed to evaluating and/or improving device performance and/or extending device operational lifetime through the use of a stress control structure described herein. As used herein a stress controlling structure means a layer, substrate, or adjacent structure, which is configured to exert a stress onto other layers of a semiconductor heterostructure. In an embodiment, a stress controlling structure described herein can deliver variable, user-controlled stresses within a semiconductor heterostructure. The stress control structure can induce tensile or compressive stresses to adjacent layers in the semiconductor heterostructure. The stress control structure can be used for device testing and/or for tuning an emission/absorption wavelength of the device.

A layer of any of the group III nitride semiconductor heterostructures described herein can be considered to be transparent to radiation of a particular wavelength when the layer allows an amount of the radiation radiated at a normal incidence to an interface of the layer to pass there through. For example, a layer can be configured to be transparent to a range of radiation wavelengths corresponding to a peak emission wavelength for light, such as ultraviolet light or deep ultraviolet light, emitted by a light generating structure (e.g., peak emission wavelength+/−five nanometers). As used herein, a layer is transparent to radiation if it allows more than approximately five percent of the radiation to pass there through, while a layer can also be considered to be transparent to radiation if it allows more than approximately ten percent of the radiation to pass there through. Defining a layer to be transparent to radiation in this manner is intended to cover layers that are considered transparent and semi-transparent.

A layer of any group III nitride semiconductor heterostructures described herein can be considered to be reflective when the layer reflects at least a portion of the relevant electromagnetic radiation (e.g., light having wavelengths close to the peak emission of the light generating structure). As used herein, a layer is partially reflective to radiation if it can reflect at least approximately five percent of the radiation, while a layer can also be considered to be partially reflective if it reflects at least thirty percent for radiation of the particular wavelength radiated normally to the surface of the layer. A layer can be considered highly reflective to radiation if it reflects at least seventy percent for radiation of the particular wavelength radiated normally to the surface of the layer.

The group III nitride semiconductor heterostructures described herein can be used to form one of a variety of optoelectronic or electronic devices. Examples of possible optoelectronic and electronic devices can include, but are not limited to, light emitting devices, light emitting diodes (LEDs), including conventional and super luminescent LEDs, light emitting solid state lasers, laser diodes, photo-detectors, photodiodes, and high-electron mobility transistors (HEMTs). These examples of optoelectronic devices can be configured to emit or sense electromagnetic radiation in an active region upon application of a bias. The electromagnetic radiation emitted or sensed by these optoelectronic devices can comprise a peak wavelength within any range of wavelengths, including visible light, ultraviolet radiation, deep ultraviolet radiation, infrared light, and/or the like. For example, these optoelectronic devices can emit or sense radiation having a dominant wavelength within the ultraviolet range of wavelengths. As an illustration, the dominant wavelength can be within a range of wavelengths of approximately 210 nanometers (nm) to approximately 350 nm.

The description that follows may use other terminology herein for the purpose of describing particular embodiments only and is not intended to be limiting of the disclosure. For example, unless otherwise noted, the term "set" means one or more (i.e., at least one) and the phrase "any solution" means any now known or later developed solution. The singular forms "a," "an," and "the" are intended to include the plural forms as well, unless the context clearly indicates otherwise. It will be further understood that the terms "comprises", "comprising", "includes", "including", "has", "have", and "having" when used in this specification, specify the presence of stated features, integers, steps, operations, elements, and/or components, but do not preclude the presence or addition of one or more other features, integers, steps, operations, elements, components, and/or groups thereof. Additionally, as used herein, "vertical" is used to reference the growth direction of the corresponding structure, while "lateral" is used to reference a direction that is perpendicular to the growth direction.

Turning to the drawings, FIG. 1 shows a semiconductor heterostructure 11 that includes semiconductor layers and is part of an optoelectronic device 10. In a more particular embodiment, the optoelectronic device 10 is configured to operate as an emitting device, e.g., a light emitting diode (LED), such as a deep ultraviolet light emitting diode (DUV LED) or a conventional or super luminescent LED. Alternatively, the optoelectronic device 10 can be configured to operate as a light emitting solid state laser, a laser diode (LD), a photo-detector, a photodiode, or another type of optoelectronic or electronic (e.g., a HEMT) device. Additional aspects of the invention are shown and described in conjunction with the optoelectronic device 10. However, it is understood that embodiments can be utilized in conjunction with any type of optoelectronic device and/or any type of group III nitride-based device.

When the optoelectronic device 10 operates as an emitting device, application of a bias comparable to the band gap results in the emission of electromagnetic radiation from an active region 18 of the device 10. The electromagnetic radiation emitted by the optoelectronic device 10 can comprise a peak wavelength within any range of wavelengths, including visible light, ultraviolet radiation, deep ultraviolet radiation, infrared light, and/or the like. In an embodiment, the optoelectronic device 10 is configured to emit radiation having a dominant wavelength within the ultraviolet range of wavelengths. In a more specific embodiment, the dominant wavelength is within a range of wavelengths between approximately 210 and approximately 350 nanometers.

The semiconductor heterostructure 11 of the optoelectronic device 10 can include a substrate 12, a buffer layer 14 (e.g., AlN, an AlGaN/AlN superlattice, and/or the like) adjacent to the substrate 12, an n-type contact semiconductor layer 16 (e.g., an electron supply layer, cladding layer and the like) adjacent to the buffer layer 14, and the active region 18 having an n-type side 19A adjacent to the n-type contact semiconductor layer 16. Furthermore, the heterostructure of the optoelectronic device 10 can include a p-type semiconductor layer 20 (e.g., an electron blocking layer) adjacent to a p-type side 19B of the active region 18 and a p-type contact semiconductor layer 22 (e.g., a hole supply layer, cladding layer, and the like), adjacent to the p-type semiconductor layer 20.

In a more particular illustrative embodiment, the optoelectronic device 10 can be a group III-V materials-based device in which some or all of the various layers of the semiconductor heterostructure 11 are formed of elements selected from the group III-V materials system. In a still more particular illustrative embodiment, the various layers of the semiconductor heterostructure 11 of the optoelectronic device 10 can be formed of group III nitride based materials. Group III nitride materials comprise one or more group III elements (e.g., boron (B), aluminum (Al), gallium (Ga), and indium (In)) and nitrogen (N), such that $B_W Al_X Ga_Y In_Z N$, where $0 \leq W, X, Y, Z \leq 1$, and $W+X+Y+Z=1$. Illustrative group III nitride materials can include binary, ternary and quaternary alloys such as, AlN, GaN, InN, BN, AlGaN, AlInN, AlBN, AlGaInN, AlGaBN, AlInBN, and AlGaInBN with any molar fraction of group III elements.

An illustrative embodiment of a group III nitride based optoelectronic device 10 can include an active region 18 (e.g., a series of alternating quantum wells and barriers) composed of $In_y Al_x Ga_{1-x-y} N$, $Ga_z In_y Al_x B_{1-x-y-z} N$, an $Al_x Ga_{1-x} N$ semiconductor alloy, or the like. Similarly, both the n-type contact layer 16 and the p-type semiconductor layer 20 can be composed of an $In_y Al_x Ga_{1-x-y} N$ alloy, a $Ga_z In_y Al_x B_{1-x-y-z} N$ alloy, or the like. The molar fractions given by x, y, and z can vary between the various layers 16, 18, and 20. The substrate 12 can be sapphire, silicon carbide (SiC), silicon (Si), GaN, AlGaN, AlON, LiGaO$_2$, or another suitable material, and the buffer layer 14 can be composed of AlN, an AlGaN/AlN superlattice, and/or the like.

As shown with respect to the optoelectronic device 10, a p-type metal electrode 24 can be attached to the p-type contact semiconductor layer 22 and a p-type contact 26 can be attached to the p-type metal electrode 24. Similarly, an n-type metal electrode 28 can be attached to the n-type contact layer 16 and an n-type contact 30 can be attached to the n-type metal electrode 28. The p-type metal electrode 24 and the n-type metal electrode 28 can form p-type and n-type ohmic contacts, respectively, to the corresponding layers 22, 16, respectively. It is understood that a contact formed between two layers is considered "ohmic" or "conducting" when an overall resistance of the contact is no larger than the larger of the following two resistances: a contact resistance such that a voltage drop at the contact-semiconductor junction is no larger than two volts; and a contact resistance at least five times smaller than a resistance of a largest resistive element or layer of a device including the contact.

In an embodiment, the p-type metal electrode 24 and/or the n-type metal electrode 28 can comprise several conductive and reflective metal layers, while the n-type contact 30 and/or the p-type contact 26 can comprise highly conductive metal. In an embodiment, the p-type contact semiconductor layer 22 and/or the p-type contact 26 can be transparent (e.g., semi-transparent or transparent) to the electromagnetic radiation generated by the active region 18. For example, the p-type contact semiconductor layer 22 and/or the p-type contact 26 can comprise a short period superlattice lattice structure, such as a transparent magnesium (Mg)-doped AlGaN/AlGaN short period superlattice structure (SPSL). Furthermore, the p-type contact 26 and/or the n-type contact 30 can be reflective of the electromagnetic radiation generated by the active region 18. In another embodiment, the n-type contact layer 16 and/or the n-type contact 30 can be formed of a short period superlattice, such as an AlGaN SPSL, which is transparent to the electromagnetic radiation generated by the active region 18.

As further shown with respect to the optoelectronic device 10, the device 10 can be mounted to a submount 36 via the contacts 26, 30. In this case, the substrate 12 is located on the top of the optoelectronic device 10. To this extent, the p-type contact 26 and the n-type contact 30 can both be attached to a submount 36 via contact pads 32, 34, respectively. The submount 36 can be formed of aluminum nitride (AlN), silicon carbide (SiC), and/or the like.

Any of the various layers of the device 10 can comprise a substantially uniform composition or a graded composition. For example, a layer can comprise a graded composition at a heterointerface with another layer. In an embodiment, the p-type semiconductor layer 20 comprises a p-type blocking layer having a graded composition. The graded composition(s) can be included to, for example, reduce stress, improve carrier injection, and/or the like. Similarly, a layer can comprise a superlattice including a plurality of periods, which can be configured to reduce stress, and/or the like. In this case, the composition and/or width of each period can vary periodically or aperiodically from period to period.

It is understood that the layer configuration of the semiconductor heterostructure 11 of the optoelectronic device 10 described herein is only illustrative. To this extent, the semiconductor heterostructure 11 can include an alternative layer configuration, one or more additional layers, and/or the like. As a result, while the various layers are shown immediately adjacent to one another (e.g., contacting one another), it is understood that one or more intermediate layers can be present in the semiconductor heterostructure 11. For example, an illustrative semiconductor heterostructure 11 can include an undoped layer between the active region 18 and one or both of the p-type contact semiconductor layer 22 and the n-type contact semiconductor layer 16 (e.g., an electron supply layer).

Furthermore, the semiconductor heterostructure 11 can include a Distributive Bragg Reflector (DBR) structure, which can be configured to reflect light of particular wavelength(s), such as those emitted by the active region 18, thereby enhancing the output power of the device/heterostructure. For example, the DBR structure can be located between the p-type contact semiconductor layer 22 and the active region 18. Similarly, the semiconductor heterostructure 11 can include a p-type layer 20 located between the p-type contact semiconductor layer 22 and the active region 18. The DBR structure and/or the p-type layer 20 can comprise any composition based on a desired wavelength of the light generated by the device/heterostructure. In one embodiment, the DBR structure comprises a Mg, Mn, Be, or Mg+Si-doped p-type composition. The p-type layer 20 can comprise p-type AlGaN, AlInGaN, and/or the like. It is understood that the semiconductor heterostructure 11 can include both the DBR structure and the p-type layer 20 (which can be located between the DBR structure and the p-type contact layer 22) or can include only one of the DBR structure or the p-type layer 20.

The group III nitride semiconductor layers that can form the semiconductor heterostructure 11 are subject to stresses due to a number reasons that can include hetero-epitaxy, a mismatch between thermal expansion coefficients of the substrate and the layers, variation in semiconductor composition and other factors. All of these factors can lead to reduced reliability and performance of the optoelectronic device 10. Incorporating one or more stress control layers in the layers of the semiconductor heterostructure 11 as described herein can alleviate or partially alleviate the stresses that build in the heterostructure.

Figure 2A:
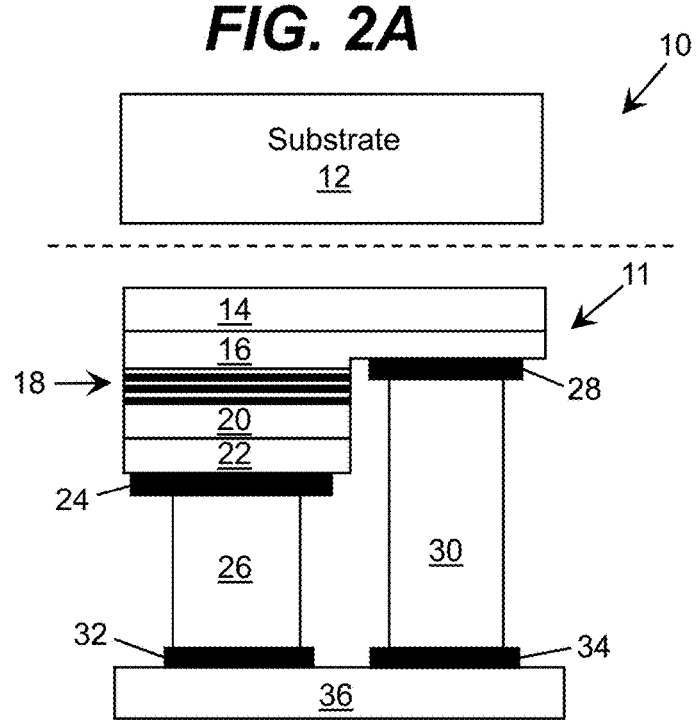
FIGS. 2A-2B disclose a schematic illustrating the formation of an optoelectronic device with the substrate used for the epitaxial growth of the semiconductor heterostructure removed and replaced with a stress controlling substrate according to an embodiment.
Figure 2B:
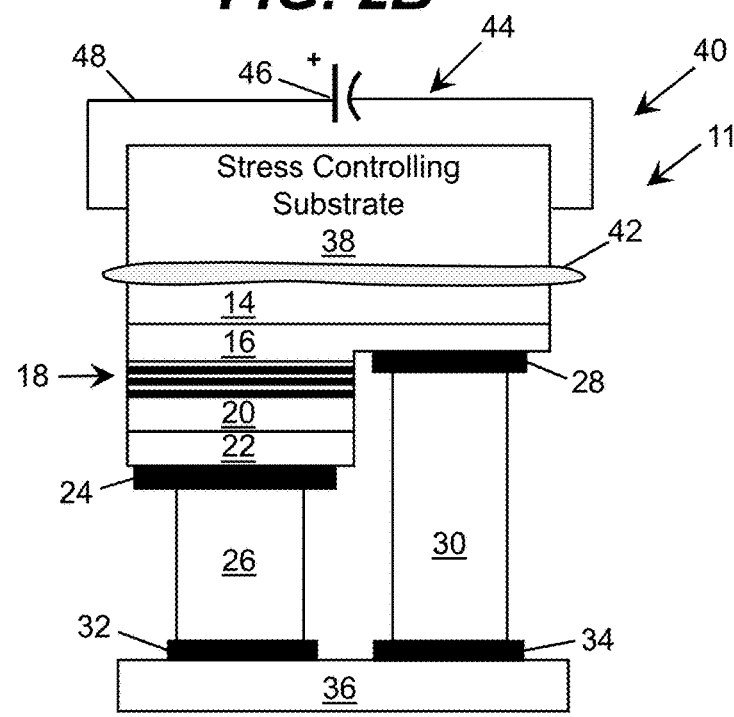

FIGS. 2A-2B disclose a schematic illustrating the formation of an optoelectronic device with the substrate used for the epitaxial growth of the semiconductor heterostructure removed and replaced with a stress controlling substrate according to an embodiment. In particular, FIG. 2A shows the optoelectronic device 10 depicted in FIG. 1 with the substrate 12 removed from the heterostructure 11, while FIG. 2B shows a stress controlling substrate 38 that replaces the removed substrate and is added to the heterostructure 11 to form an optoelectronic device 40. As used herein, a stress controlling substrate is a layer that can exert stress on the semiconductor layers within the device structure. As described herein, the stress controlling layer can be utilized to exert a user-defined and controlled, variable stress onto one or more of the semiconductor layers in the device heterostructure.

Referring to FIG. 2A, the substrate 12 can be removed from the heterostructure 11 using one of a number of well-known techniques. For example, the substrate 12 can be removed from the semiconductor heterostructure 11 using a lift-off technique such as a laser lift-off that irradiates the semiconductor layers of the heterostructure from the substrate 12 side. A laser lift-off is a well-known technique in the art that is used to separate semiconductor layers from a substrate, which can result in improved characteristics of a subsequently fabricated optoelectronic device. U.S. patent application Ser. No. 15/200,575 provides further details of several laser-lift off techniques that can be used to irradiate group III nitride semiconductor layers from the substrate side to decompose a sacrificial layer, and is incorporated herein by reference.

In the embodiment depicted in FIG. 2A, the substrate 12 is lifted off the semiconductor heterostructure 11 upon the application of a laser emission. In particular, a laser emission at a specified wavelength is absorbed by the substrate 12, causing it to separate from the semiconductor heterostructure 11. In another embodiment, a sacrificial layer can be formed on the substrate 12 and used with the substrate to facilitate the epitaxial growth of the semiconductor heterostructure 11. In this manner, during the laser lift-off, the laser emission can be absorbed by the sacrificial layer, causing it to decompose, separating the semiconductor heterostructure 11 from the substrate 12.

The stress controlling substrate 38 of FIG. 2B can attach to the semiconductor heterostructure 11 through one of a multitude of approaches. In one embodiment, solder 42 can be used to solder the stress controlling substrate 38 to the semiconductor heterostructure 11. Other approaches can include, but are not limited to, gluing the device with an adhesive, such as an epoxy.

In one embodiment, the stress controlling substrate 38 can include a piezoelectric material which enables mechanical stresses to be induced onto semiconductor layers of the heterostructure 11 through the application of a voltage onto the substrate 38. Examples of piezoelectric material that are suitable for use with the stress controlling substrate include, but are not limited to, $LiNbO_3$, $LiTaO_3$, PZT, quartz, etc. In one embodiment, the stress controlling substrate 38 can include an ultraviolet transparent substrate such as AAO or $SiO_2$ having the piezoelectric material. In another embodiment, the ultraviolet transparent stress controlling substrate 38 can be patterned with elevated regions (e.g., hills) with flat depressions (e.g., valleys) formed between each of the elevated regions. The elevated regions can include the piezoelectric material to form stress control regions or domains, with each stress control region separated from adjacent stress control regions by a predetermined spacing. It is understood that different patterning shapes can be used besides elevated regions and flat depressions. The patterning shapes can comprise regions having at least one dimension in a range of several microns or several tens of microns.

The semiconductor heterostructure 40 of FIG. 2B can further include a stress inducing component 44 that is configured to induce a change in stress within the stress controlling substrate 38. The stress inducing component 44 can include utilize any combination of one or more of a number of approaches that can induce a target stress or strain within the stress controlling substrate 38. Examples of stresses that can be imparted by the stress inducing component include, but are not limited to periodic stresses through a series of stress impulses, thermal stresses, electrical stresses, and radiation stresses.

In one embodiment, as depicted in FIG. 2B, the stress inducing component 44 can include a current source 46 that passes an electrical current through the stress controlling substrate 38 using leads 48. The electrical current causes the stress controlling substrate 38 to heat through Joule heating, otherwise known as ohmic heating and resistive heating. The Joule heating of the stress controlling substrate 38 induces a thermal heating stress that can cause thermal expansion of the controlling substrate 38, which leads to tensile stresses within the semiconductor heterostructure 11. The tensile stresses within the semiconductor heterostructure 11 can lead to changes in the band diagram and overall changes in the emission wavelength, intensity, and/or efficiency, of the device. The generation of tensile stresses within the semiconductor heterostructure 11 can be used, for example, for testing a quality of the semiconductor heterostructure. To this extent, in cases when the semiconductor heterostructure is of a relatively poor quality, the additional tensile stresses can lead to an increased rate of deterioration of the semiconductor heterostructure.

In one embodiment, the stress inducing component 44 can induce an electrical stress in the stress controlling substrate 38 having piezoelectric materials by generating an electric field in the substrate. For example, the stress inducing component 44 can generate the electric field in the stress controlling substrate 38 by applying a voltage to anode and cathode electrodes. The electric field applied to the stress controlling substrate 38 leads to a mechanical deformation of the substrate.

Figure 3:
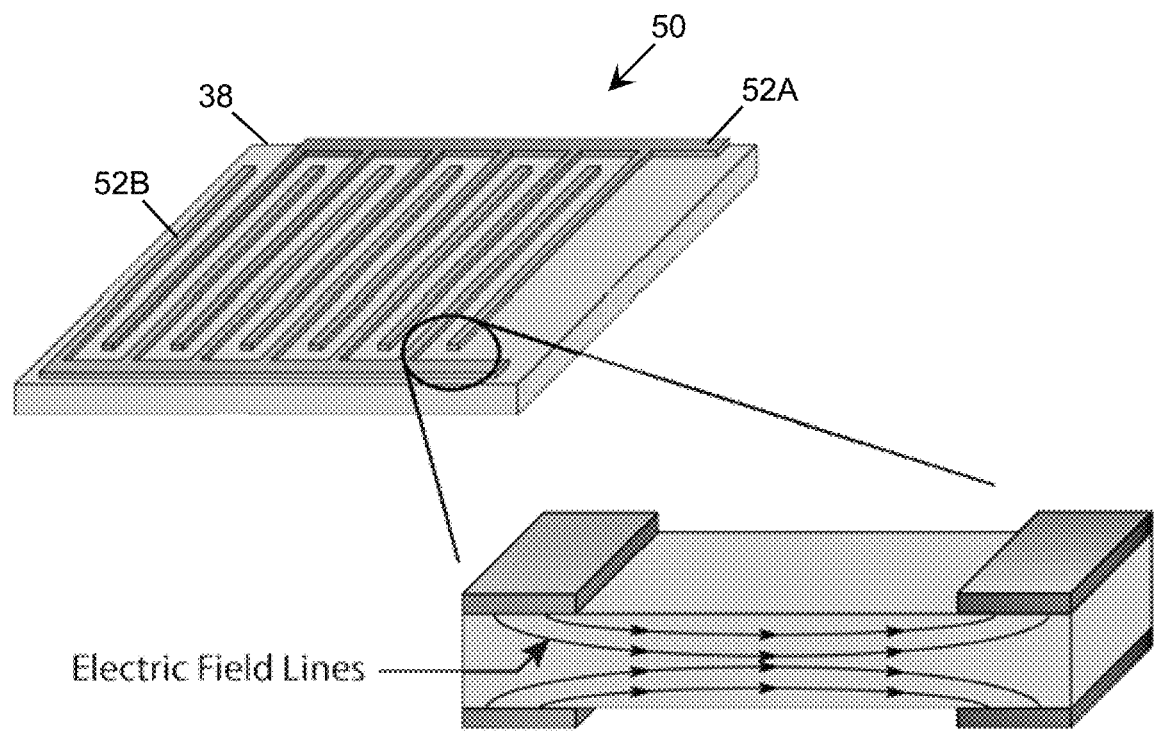
FIG. 3 shows a schematic of a stress controlling substrate with interdigitated electrodes formed thereon to operate in conjunction with a stress inducing component to impart a target stress or strain in the semiconductor heterostructure of an optoelectronic device according to an embodiment.

Electrodes can be used to impart the electric field from the stress inducing component 44 to the stress controlling substrate 38 for activation of the electrical stresses. FIG. 3 shows a schematic of the stress controlling substrate 30 with interdigitated electrodes 50 formed on one side of the substrate. The interdigitated electrodes 50 operate in conjunction with a stress inducing component (not depicted) to impart a target stress or strain in the semiconductor heterostructure (not depicted) of an optoelectronic device (not depicted). As shown in FIG. 3, the interdigitated electrodes 50 can include individual interdigitated comb-like electrode structures 52A, 52B facing each other with the individual electrode structures of the comb-like structures interleaved.

An optoelectronic device with stress controlling substrate 38 and interdigitated electrodes 50 as depicted in FIG. 3 can be fabricated in a number of approaches. For example, consider a scenario in which the stress controlling substrate 38 is a patterned ultraviolet transparent substrate formed of piezoelectric material. In one embodiment, fabricating an optoelectronic device with an ultraviolet stress controlling substrate can include preparing the substrate for epitaxial growth by patterning the substrate. As mentioned above, patterning the stress controlling substrate for epitaxial growth can include forming elevated region between flat depressions. The interdigitated electrodes can then be deposited on one side of the substrate, while the piezoelectric material can be deposited over the patterned side of the ultraviolet transparent substrate. Next, the semiconductor layers that form the semiconductor heterostructure of the optoelectronic device can be epitaxially grown on the substrate.

In the configuration depicted in FIG. 3, the stress that is induced in the stress controlling substrate 38 by the stress inducing component via the interdigitated electrodes 50 will be a function of the location, the position, the separation and the orientation of the electrodes that form the set of interdigitated electrodes 50. In particular, those skilled in the art will appreciate that the location, the position, the separation and the orientation of the electrodes 50 can be determined based on the piezoelectric material in the stress controlling substrate 38 as these materials generally have non-uniform piezoelectric properties in different directions.

In general, the stresses within the piezoelectric material can be described by:

$$S_{jk} = \Sigma_{jk} d_{ijk} E_i,$$

where d is a piezoelectric tensor, S is a strain tensor, $E_i$ is the applied electric field, and j, k, and i are indexes of the corresponding tensors. In addition, changes in strain of semiconductor layers can affect the index of refraction as described by:

$$\Delta\left(\frac{1}{n^2}\right)_{ij} = \sum_{kl} P_{ijkl} S_{kl},$$

where P is a photo-elastic tensor, S is a strain tensor, and $$\Delta\left(\frac{1}{n^2}\right)_{ij}$$

is a second rank tensor describing changes in index of refraction. The changes in optical properties of these layers under stress lead to changes in light emission, where the changes can include changes in emission wavelength, changes in emission intensity, and/or changes in an angular distribution of the emitted light.

FIG. 3 shows an exploded view of a section between two interleaved electrodes and an example of electric field lines that can result from having the interdigitated electrodes oriented in this manner. As shown in this example, the electric field within the material can lead to piezoelectric stresses. To this extent, the stress controlling substrate can induce either tensile or compressive stresses onto the semiconductor layers. The type of stresses can be varied based on the direction of the electric filed within the piezo-electric material. For instance, when the electric field lines propagate from left to right the stresses can be compressive, but when the electric field lines propagate from right to left the induced stresses within semiconductor layers can be tensile.

In addition to application of an electric field by the interdigitated electrodes 50 to control stresses within the piezoelectric material based stress controlling substrate 38, changes in temperature can further affect the stresses within the substrate. In particular, a change in temperature can lead to changes in the piezoelectric properties of the substrate as well as thermal expansion of the substrate.

Figure 4A:
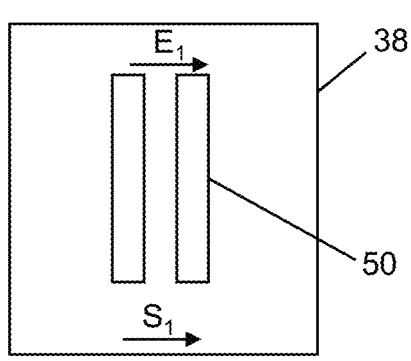
FIGS. 4A-4B show examples of different orientations that the interdigitated electrodes depicted in FIG. 3 can have in relation to the stress controlling substrate according to an embodiment.
Figure 4B:
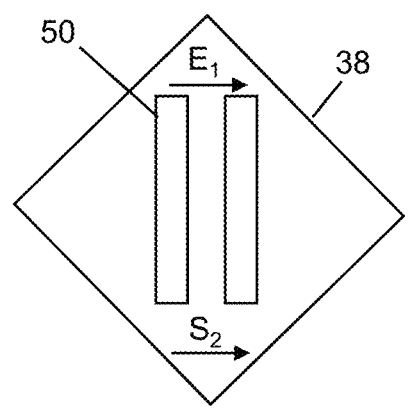

FIGS. 4A-4B show examples of different orientations that the interdigitated electrodes 50 depicted in FIG. 3 can have in relation to the stress controlling substrate 38 according to embodiments. In particular, FIG. 4A shows the stress controlling substrate 38 and the electrodes 50 having the same orientation, whereas in FIG. 4B, the substrate is rotated with respect to the orientation of the electrodes. Each of these examples of orientations of the electrodes 50 relative to the stress controlling substrate 38 in general lead to different stresses within the substrate. For example, in FIG. 4A, the stress controlling substrate 38 will have a stress pattern characterized by compressive or tensile stress along a first lattice direction, while in FIG. 4B, the stress controlling substrate 38 will have a stress pattern characterized by compressive or tensile stress along a different lattice direction.

Figure 5:
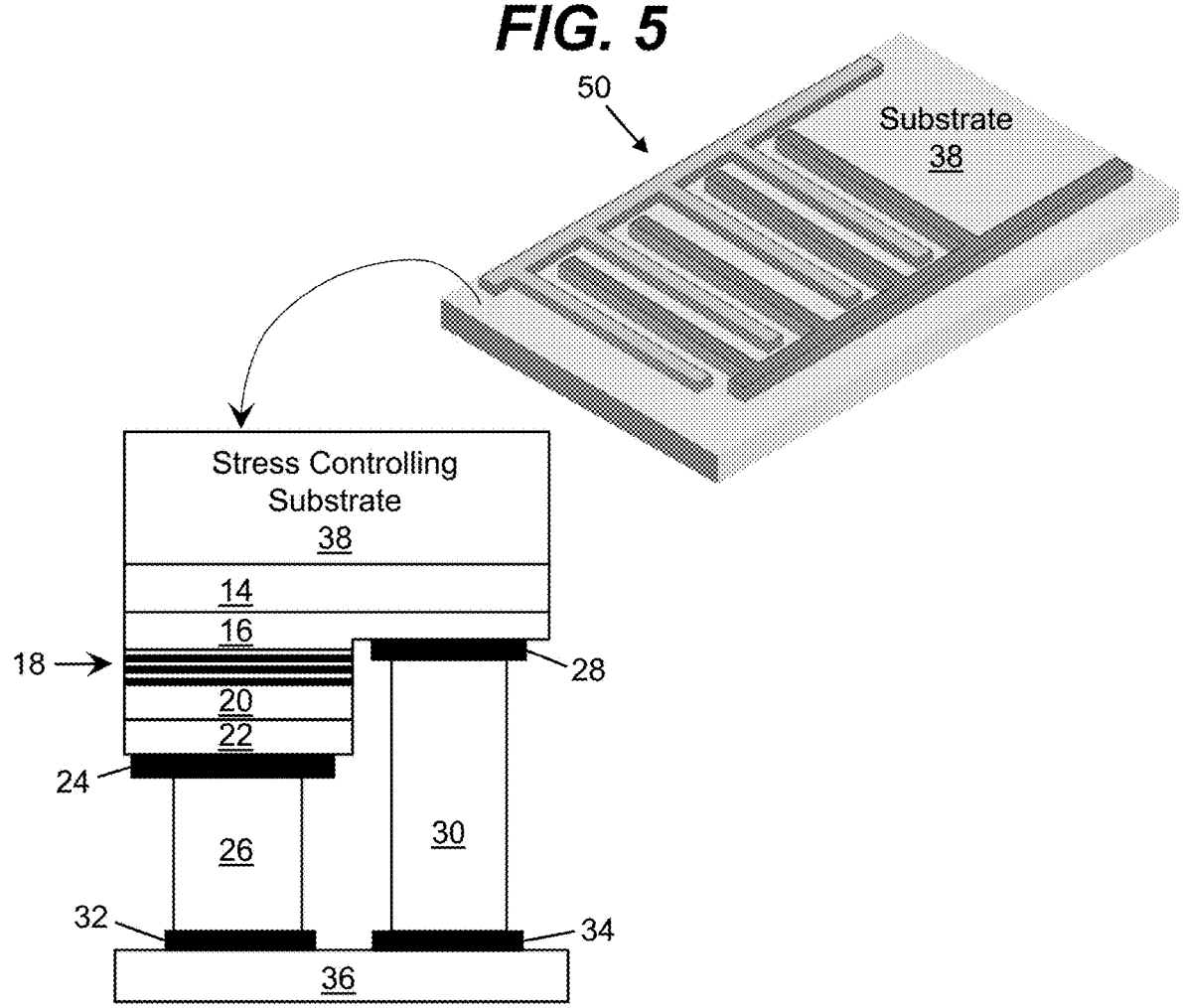
FIG. 5 shows an example of a time-periodic stress signal activated in a semiconductor heterostructure having a stress controlling substrate with interdigitated electrodes formed thereon according to an embodiment.
Figure 5:
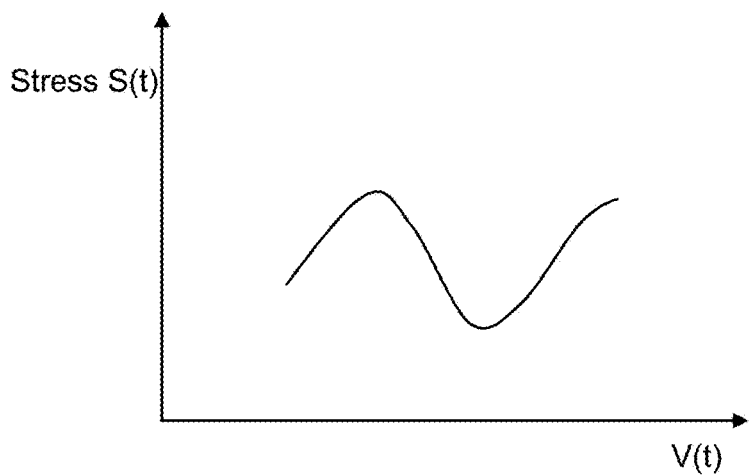

As mentioned above, a stress inducing component can induce a stress in the stress controlling substrate 38 that is implemented with the interdigitated electrodes 50 by generating an electric field in the substrate or passing an electric current that causes Joule heating of the substrate. In either scenario, the stress in the stress controlling substrate 38 can be induced or activated through a time depending electric signal. This electric signal results in a time dependent stress that can include a compressive or a tensile stress that is exerted over the optoelectronic device incorporating the stress controlling substrate 38. In one embodiment, these time dependent stresses (i.e., compressive and tensile stresses) can be exerted in a lateral direction of the stress controlling substrate 38. FIG. 5 shows an example of a time-periodic stress signal activated in a semiconductor heterostructure like the one depicted in FIG. 1, but with a stress controlling substrate 38 and interdigitated electrodes 50 formed thereon. It is understood, that the magnitude of the stresses induced in the stress controlling substrate 38 can be calibrated or inferred by analyzing the changes in the peak wavelength of the optoelectronic device and/or changes in full width at half maxima (FWHM) for such an emission from the device.

Figure 6:
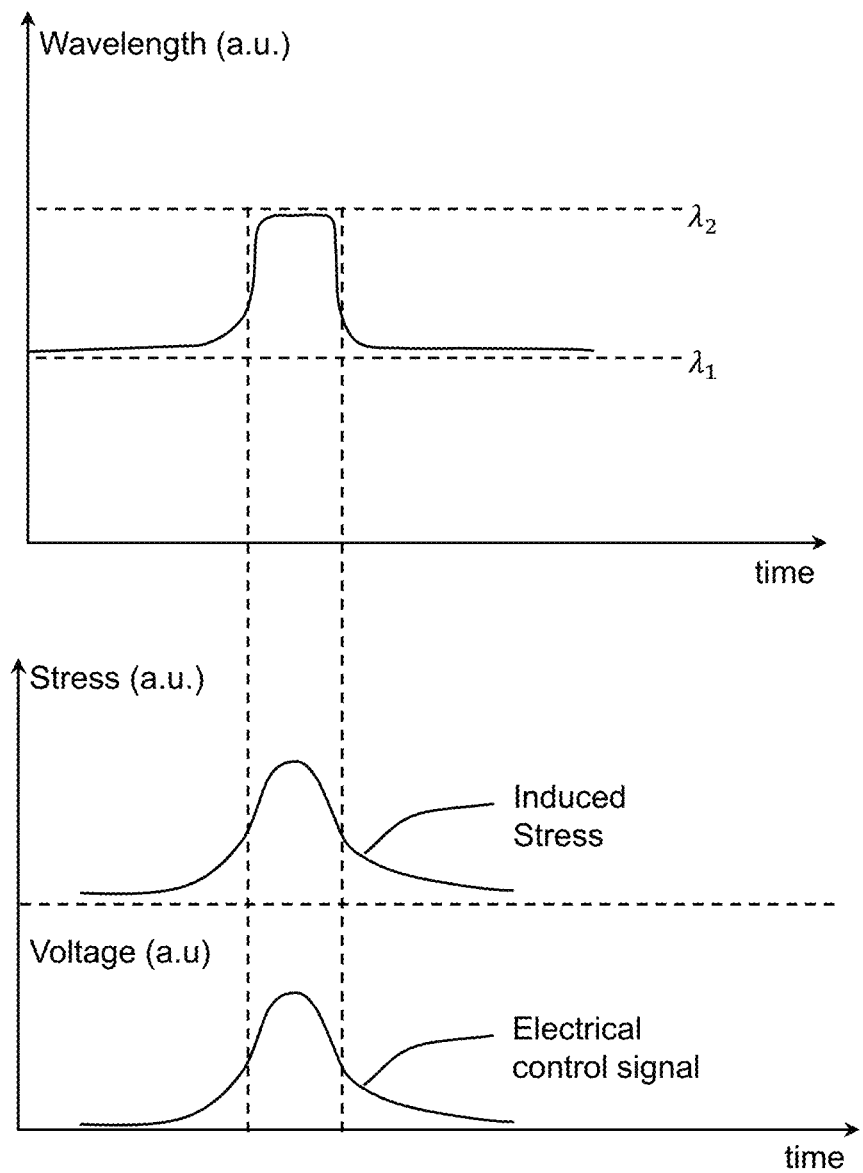
FIG. 6 shows an example of a time-dependent stress signal activated in a semiconductor heterostructure having a stress controlling substrate according to an embodiment

It is understood that the various embodiments described herein are not meant to be limited to using time-periodic stress signals to induce stresses in the stress controlling substrate 38. For example, FIG. 6 shows an example of a time-dependent stress signal activated in a semiconductor heterostructure depicted in FIG. 2B in which solder 42 is used to attach the stress controlling substrate 38 to the semiconductor heterostructure. The upper graph in FIG. 6 shows changes in the emitted/absorbed wavelength as a function of time during which the stress has been applied, while the lower graph in FIG. 6 shows schematically the induced stress and the applied voltage that used to generate the piezoelectric stress. The use of voltage for controlling stress results in an ability to apply variable stress as a complicated function of time.

Figure 7:
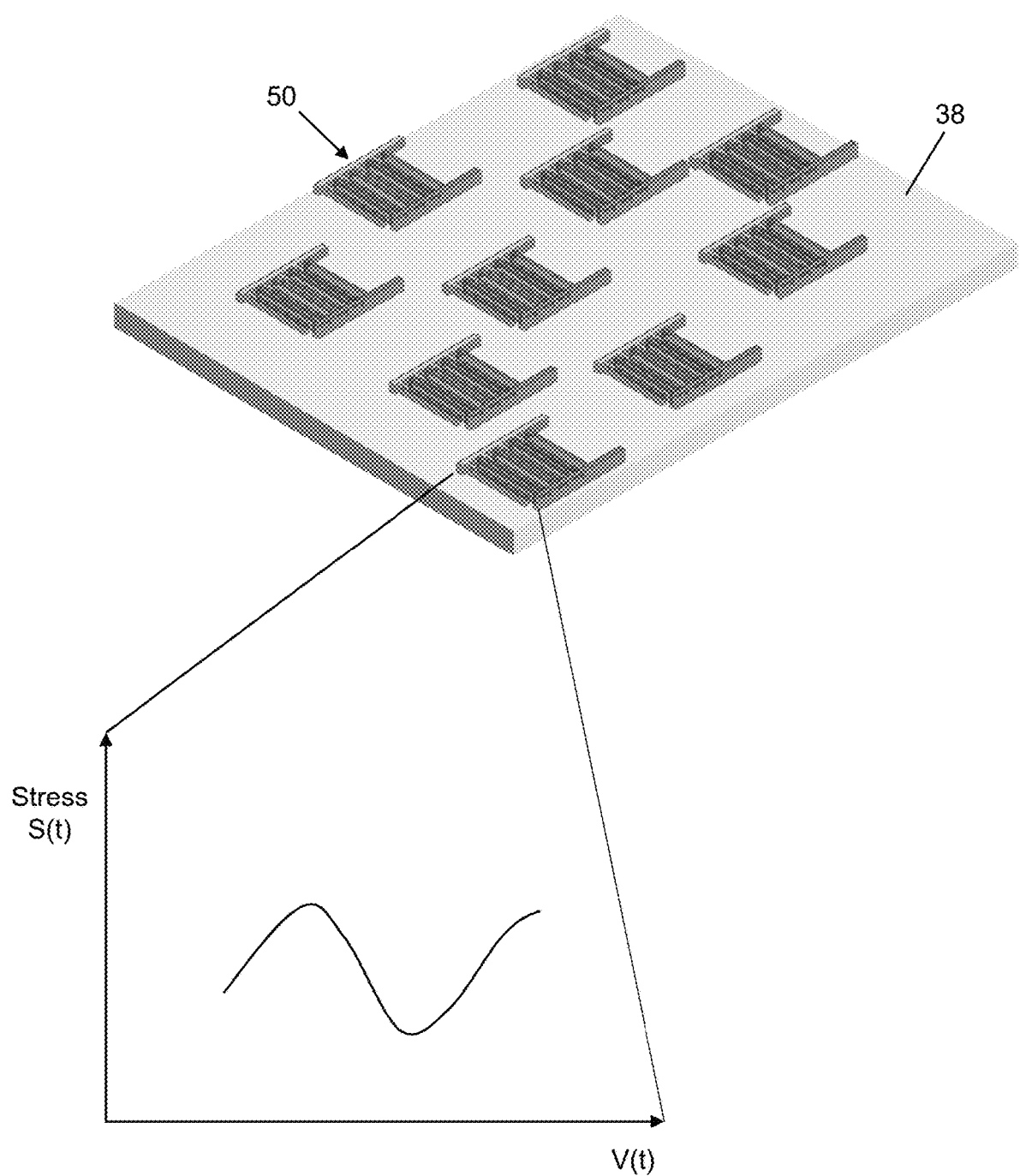
FIG. 7 shows a schematic of a stress controlling substrate with multiple sets of interdigitated electrodes formed on one side thereof according to an embodiment.

FIG. 7 shows another embodiment in which multiple sets of interdigitated electrodes 50 like those depicted in FIGS. 3, 4A, 4B and 5 can be implemented with a stress controlling substrate 38. In particular, FIG. 7 shows a schematic of the stress controlling substrate 38 with multiple sets of interdigitated electrodes 50 formed on one side according to an embodiment. Each set of the interdigitated electrodes 50 can include individual interdigitated comb-like electrode structures facing each other with the individual electrode structures of the comb-like structures interleaved. In one embodiment, the sets of interdigitated electrodes 50 can be formed on the stress controlling substrate 38 and operatively coupled with a stress inducing component (not shown).

In this manner, the stress and/or the changes in stress that can be induced in the stress controlling substrate 38 by the plurality of sets of interdigitated electrodes 50 and the stress inducing component is a function of the location, the position, the separation and the orientation of the electrodes that form each set of interdigitated electrodes. For example, the location, the position, the separation, and the orientation of the electrodes in the sets of interdigitated electrodes can be configured to produce a non-uniform distribution of stress in a lateral direction. Producing a non-uniform distribution of stresses in the lateral direction of the stress controlling substrate 38 can be used, for example, to test the quality of devices under non-uniform stresses. To this extent, such testing can be done to evaluate the device structure and to evaluate device failure mechanisms. For example the stress at device edges can lead to a faster device failure than stress at the device center, giving an indication that failure mechanism happens in the proximity of edges.

In one embodiment, the sets of interdigitated electrodes 50 depicted in FIG. 7 can be activated synchronously to produce a stress wave that propagates through the stress controlling substrate 38. Such activation can be obtained by delivering appropriate time dependent voltage on the interdigitated electrodes. The stress controlling substrate 38 responds to the propagating wave by developing stresses which are translated into tensile and compressive stresses within the semiconductor layers. In one embodiment, the propagating wave can include, but is not limited to, surface acoustic waves, surface stress waves, and/or the like. In one embodiment, the stress wave can have a distribution through the stress controlling substrate 38 that is steady (i.e., does not change or changes only very little, such as +/−2%), but laterally inhomogeneous. In an embodiment, the stress inducing component can selectively apply the stress using all or a selected subset of one or more of the sets of interdigitated electrodes 50.

Figure 8:
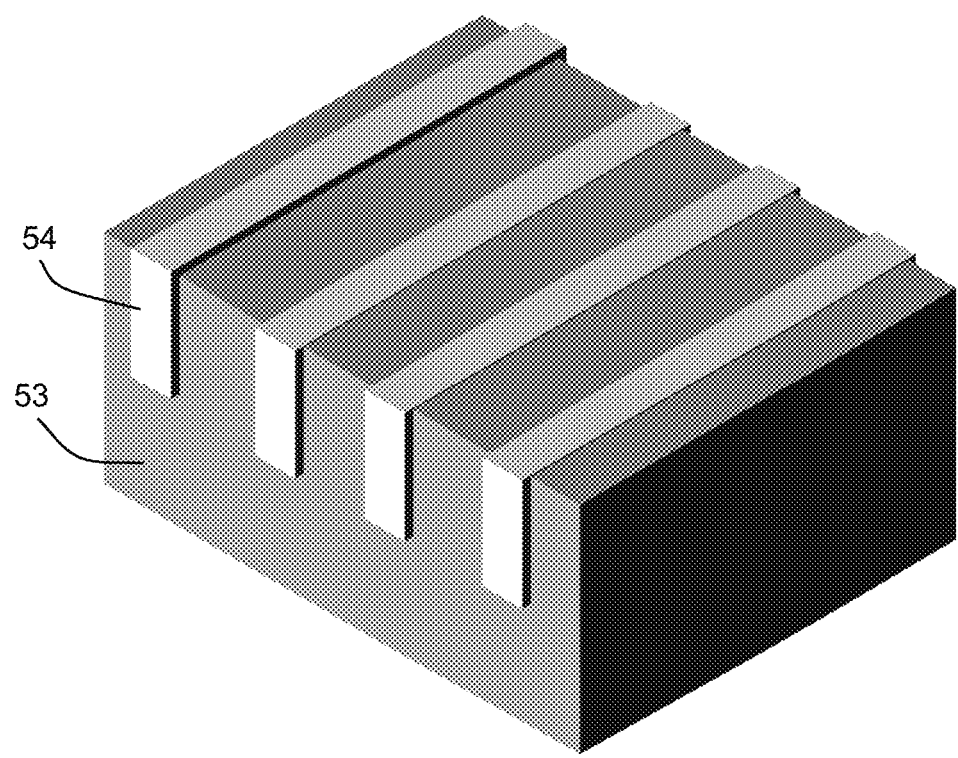
FIG. 8 shows a schematic of a stress controlling layer having a plurality of domains having piezoelectric properties according to an embodiment.

FIG. 8 shows a schematic of a stress controlling layer 53 formed having a plurality of domains 54 according to an embodiment. The stress controlling layer 53 with domains 54 is suitable for use in an optoelectronic device as a stress controlling substrate or as one of the layers in a semiconductor heterostructure that forms part of the device. As shown in FIG. 8, each of the domains 54 can extend along the length of the stress controlling layer 53 and are separated from adjacent domains by predetermined spacing. In this manner, all of the spaced domains 54 extend laterally across the width of the stress controlling layer. In one embodiment, the domains 54 can have piezoelectric properties. As used herein, piezoelectric properties means properties related to the generation of stress within the material under an applied electric field. To this extent, a stress inducing component can apply an electric field to the domains 54 which creates a stress in the stress controlling layer 53. Depending on whether the stress controlling layer 53 is used as a stress controlling substrate or as a layer in the semiconductor, the stress controlling layer responds to the stress within the domains 54 by acquiring compressive or tensile strain. Having the spaced domains 54 with piezoelectric properties in the stress controlling layer 53 enables control of the strain (and as a result, stress) within the stress controlling layer 53 through the application of an electric field to domains 54.

In one embodiment, the domains 54 can include composite domains having temperature activated materials that are configured for Joule heating. For example, the composite domains can include, but are not limited to, metallic domains 54 and a semiconductor or dielectric domain 53. For example, the domain 53 can comprise sapphire, AlN, $Al_2O_3$, Si, $SiO_2$, $LiNbO_3$, and/or the like. To this extent, a stress inducing current can pass a current through the domains of temperature activated materials which leads to heating of the stress controlling layer 53. As noted above, the stress controlling layer 53 can respond to the stress (e.g., a thermal stress) by contracting or stretching, resulting in stresses within the stress controlling layer 53. Having the spaced domains 54 with temperature activated materials in the stress controlling layer 53 enables control of strain (and as a result stress) within the stress controlling layer 53. In one embodiment, each of the composite domains with temperature activated materials can have a coefficient of thermal expansion that is higher than the coefficient of thermal expansion of the stress controlling layer 53. In this manner, an application of temperature to these domains through Joule heating can lead to a generation of stresses within the stress controlling layer 53 due to the difference in the coefficients of thermal expansion of the different domains which can be used to exert stresses on semiconductor layers adjacent to the stress controlling layer 53.

It is understood that the domains 54 of piezoelectric properties or temperature activated materials can be implemented in the stress controlling layer 53 in a variety of approaches and are not limited to the embodiment depicted in FIG. 8. For example, the stress controlling layer 53 can be configured with a laminate of layers. In this manner, some of the layers in the laminate can have piezoelectric properties or temperature activated materials.

Figure 9:
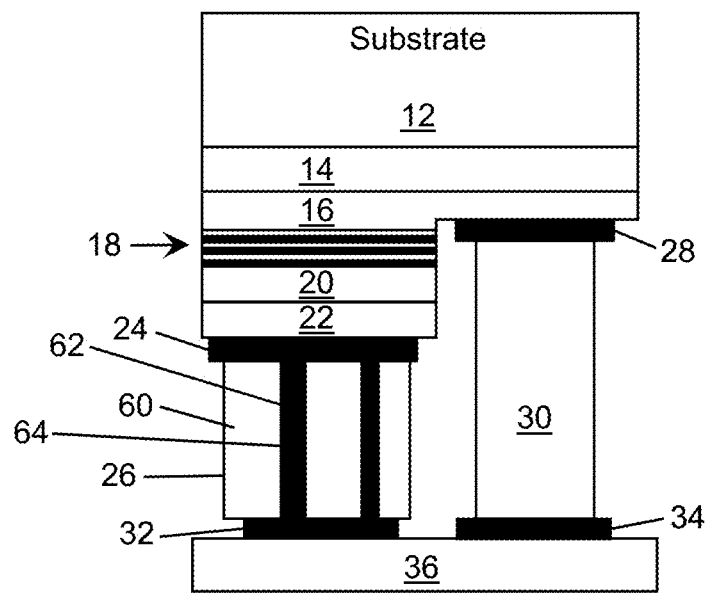
FIG. 9 shows a schematic of a semiconductor heterostructure with a stress controlling layer having a set of disjointed domains formed about a p-type metallic contact layer according to an embodiment.

FIG. 9 shows a schematic of an optoelectronic device 56 with a semiconductor heterostructure 58 having a stress controlling layer 60 with a set of disjointed domains 62 formed about a p-type metallic contact layer 26 according to an embodiment. Although the stress controlling layer 60 is depicted in FIG. 9 as formed about the p-type metallic contact 26, it is understood that this stress controlling layer can be formed in the n-type metallic contact 30. In one embodiment, the stress controlling layer 60 can have vertically extending vacancies 64 formed therein that contain protrusions emanating from the p-type metal electrode 24. To this extent, the stress controlling layer 60 defines a plurality of disjointed domains, with each of the disjointed domains separated from an adjacent disjointed domain by the protrusions emanating from the p-type metal electrode 24. The disjointed domains can include, but are not limited to, piezoelectric materials, temperature activated materials, etc. Having the stress controlling layer 60 with a set of disjointed domains 62 about the p-type metallic contact 26 as shown in FIG. 9 enables stresses to be exerted on the semiconductor layers, and in particularly, semiconductor layers within the active layer.

Figure 10:
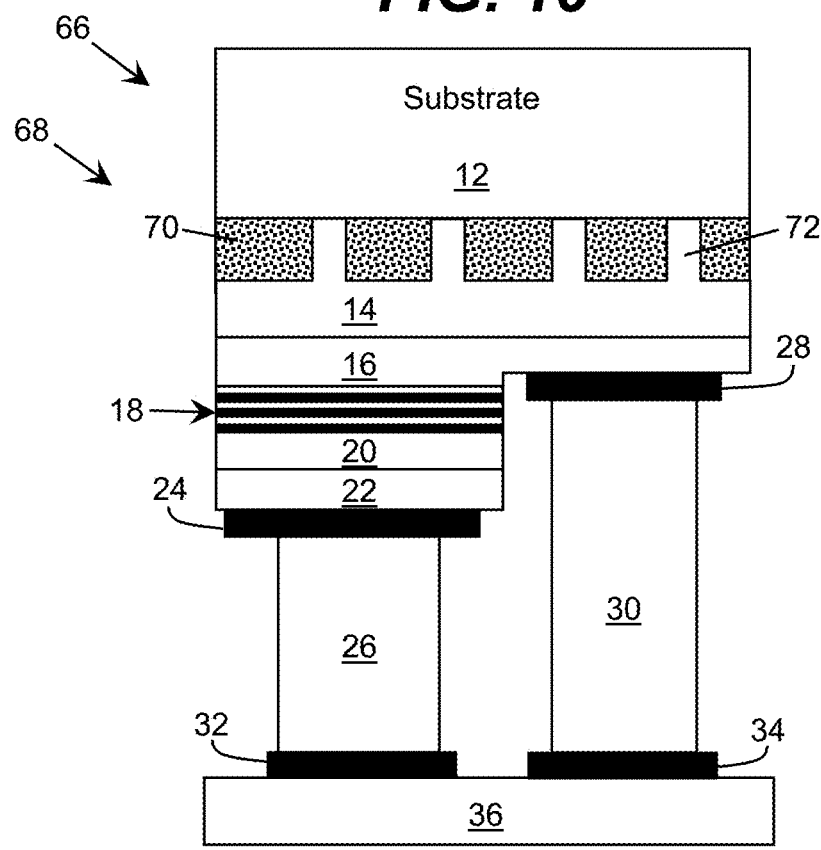
FIG. 10 shows a schematic of a semiconductor heterostructure with a stress controlling layer having a set of disjointed domains that extend laterally between a substrate and a buffer layer according to an embodiment.

FIG. 10 shows a schematic of an optoelectronic device 66 with a semiconductor heterostructure 68 having a stress controlling layer 70 with a set of disjointed domains 72 that extend laterally between the substrate 12 and the buffer layer 14 according to an embodiment. As shown in FIG. 10, each of the disjointed domains 72 of the stress controlling layer 70 can be separated from an adjacent disjointed domain by a portion of the buffer layer 14. The disjointed domains 72 can include, but are not limited to, piezoelectric materials, temperature activated materials, etc.

The optoelectronic device 66 and the semiconductor heterostructure 68 of FIG. 10 can be formed using in one of a variety of approaches. In one embodiment, a method of fabricating the device depicted in FIG. 10 can involve steps of masking or etching. For example, in a first embodiment, masking material can be placed over the substrate 12. This is followed by the epitaxial growth of the buffer layer 14 and possibly the semiconductor layers of the heterostructure 68. The device can then be removed from a Metal-Organic Chemical Vapor Deposition (MOCVD) chamber. The masking material can either be removed or remain intact with the stress controlling layer 70 deposited in the regions that contained (or contain) the masking material. In an alternative embodiment, the buffer layer 14 can be grown over the substrate 12, followed by the step of etching, with the stress controlling layer 70 deposited into etched regions. It is understood that prior to deposition of the stress controlling layer 70, the metallic electrodes can be deposited in order to provide an activation mechanism for the stress controlling layer through the application of an electric field. In another alternative embodiment, layers that will be used for Joule heating can be deposited as well.

Figure 11:
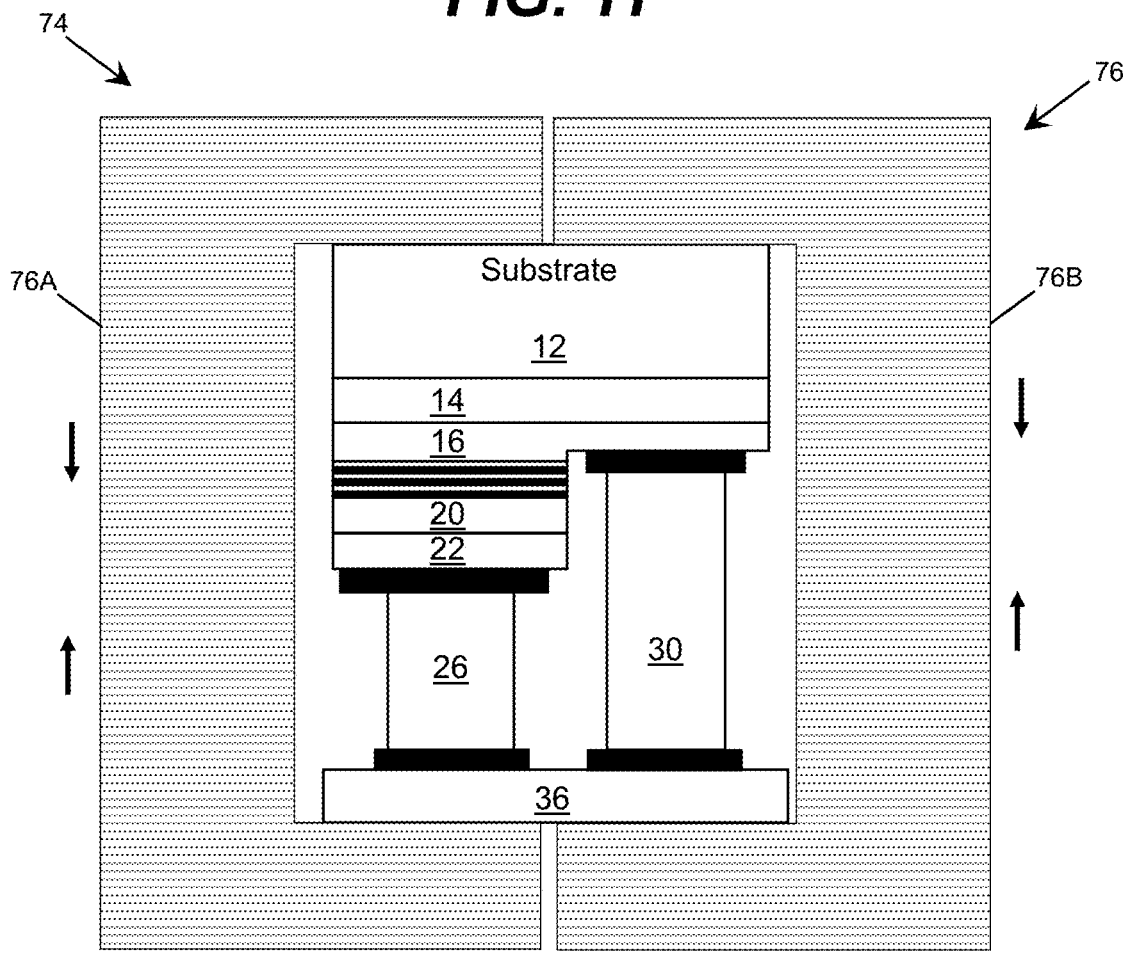
FIG. 11 shows a schematic of a stress controlling structure that at least partially confines a semiconductor heterostructure and a substrate on all sides, wherein the stress controlling structure exerts a mechanical stress on the semiconductor heterostructure and the substrate in a vertical direction according to an embodiment.

FIG. 11 shows a schematic of an optoelectronic device 74 with a stress controlling domain 76 (76A and 76B) that substantially confines the semiconductor heterostructure and the substrate 12 and the buffer layer 14 on at least four sides. In this embodiment, the stress controlling domain 76 (76A and 76B) can contact the substrate 12 and the submount 36 and exert a mechanical stress on the semiconductor heterostructure and the substrate 12 and the buffer layer 14 in a vertical direction. The stress controlling domain 76 (76A and 76B) can include the aforementioned piezoelectric materials and the temperature activated materials. In this manner, the material of the stress controlling domain 76 can exert a mechanical stress due to its expansion. Having the stress controlling domain 76 (76A and 76B) substantially confine the semiconductor heterostructure and the substrate 12 and buffer layer 14 on at least four sides in order to exert a mechanic stress in a vertical direction as shown in FIG. 11 enables application of vertical compressive stresses within semiconductor structure that can affect both the operation and the optical properties of the semiconductor structure.

Figure 12:
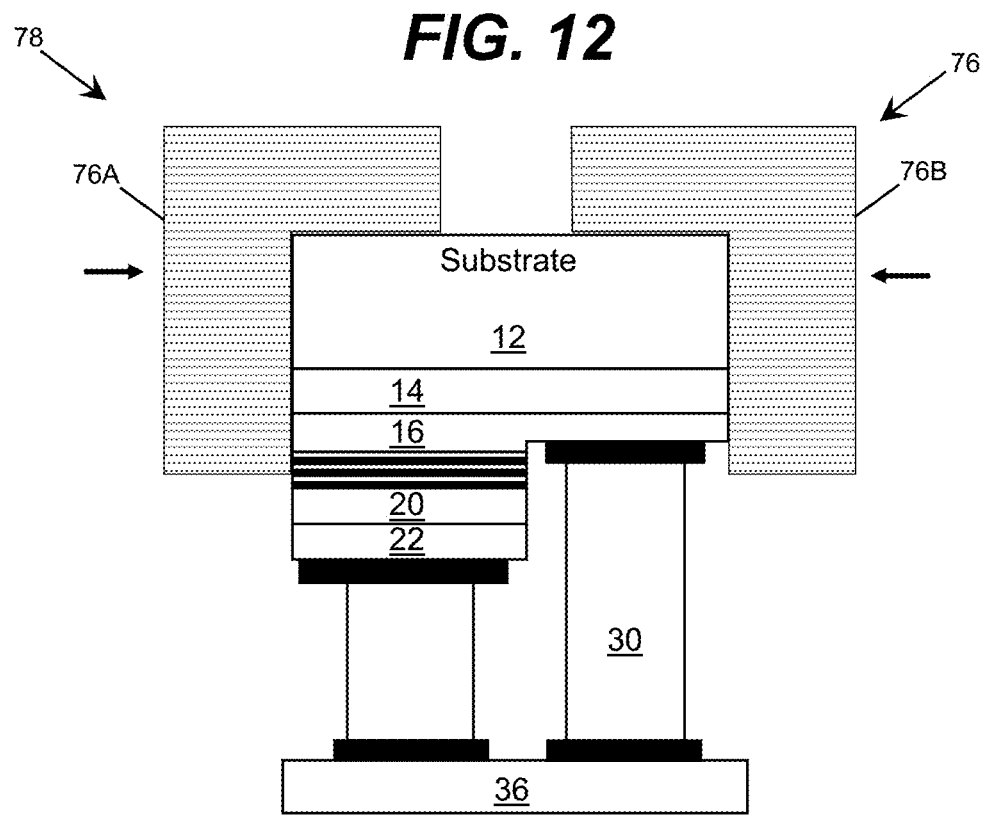
FIG. 12 shows a schematic of a stress controlling structure that at least partially confines a substrate and a portion of a semiconductor heterostructure, wherein the stress controlling structure exerts a mechanical stress on the semiconductor heterostructure and the substrate in a lateral direction according to an embodiment.

It is understood that other configurations can be utilized to exert a mechanical stress on the exterior of the semiconductor heterostructure and the substrate 12 and buffer layer 14. For example, FIG. 12 shows a schematic of an optoelectronic device 78 with a stress controlling domain 76 (76A and 76B) that confines only a portion of the semiconductor heterostructure. In one embodiment, the stress controlling domain 76 (76A and 76B) can confine the substrate 12 and buffer layer 14 and at least some of the semiconductor layers (e.g., layer 16) of the heterostructure. It is understood that the amount of coverage over the heterostructure can be variable and thus, this embodiment is not meant to be limited to the configuration depicted in FIG. 12. In this embodiment, the stress controlling domain 76 (76A and 76B) can exert a mechanical stress in a horizontal direction. Having the stress controlling domain 76 (76A and 76B) confine the substrate 12 and buffer layer 14 on all sides and cover a portion of the heterostructure in order to exert a mechanical stress in a horizontal direction as shown in FIG. 12 enables in plane compressive stresses to be applied within the semiconductor structure, which can affect both the operation and the optical properties of the semiconductor structure.

Figure 13:
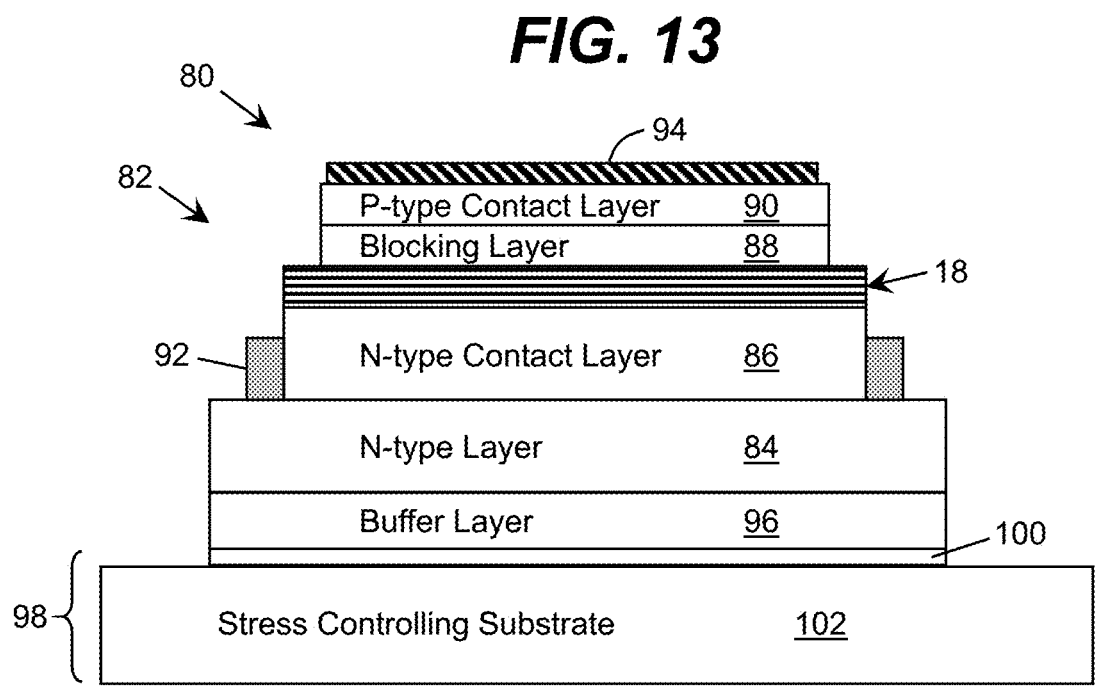
FIG. 13 shows a schematic of an optoelectronic device having a semiconductor heterostructure with a buffer layer and a thinned substrate formed on a stress controlling substrate according to an embodiment.

FIG. 13 shows a schematic of another optoelectronic device 80 with a stress controlling layer according to an embodiment. The optoelectronic device 80 differs from the previously described devices in that it includes a semiconductor heterostructure 82 having a mesa structure. As shown in FIG. 13, the mesa structure-shaped heterostructure 82 includes an n-type semiconductor layer 84 (e.g., a contact layer, an electron supply layer, cladding layer, and the like) and an n-type contact layer 86 formed on one side (e.g. the n-type side) of an active region 18, and a blocking layer 88 and a p-type contact layer 90 formed on an opposite side (e.g. the p-type side) of the active region 18. In one embodiment, the blocking layer 88 can operate as a p-type semiconductor layer (e.g., an electron blocking layer). The n-type semiconductor layer 84, the n-type contact layer 86, the active region 18, and the blocking layer 88 can include any elements selected from the group III-V materials system including, but not limited to, group III nitride-based materials. To this extent, an embodiment of the p-type contact layer 90 can be formed of gallium nitride. In an another embodiment, the p-type contact layer 90 can comprise $Al_xIn_yB_zGa_{1-x-y-z}N$ layer with 0≤x, y, z, 1-x-y-z≤1.

The semiconductor heterostructure 82 can further include an n-type metal electrode 92 attached to the n-type semiconductor layer 84 and the n-type contact layer 86, and a p-type metal electrode 94 attached to the p-type contact layer 90. Both the n-type metal electrode 92 and the p-type metal electrode 94 can include highly conductive metals, including but not limited to, Ni, Pd, Rh, Al, Au, Ag, Ti, Cr, and/or the like.

The semiconductor heterostructure 82 can be formed on a buffer layer 96 and a substrate 98. In particular, the buffer layer 96 can be formed between the n-type semiconductor layer 84 and the substrate 98. The substrate 98 can include a thinned substrate 100 and a stress controlling substrate 102. As used herein, a thinned substrate means a substrate with a reduced thickness, where the reduced thickness can be obtained through polishing, for example. Using the thinned substrate 100 in this embodiment obviates the need for completely removing a substrate from the semiconductor heterostructure 82 as in the previously described embodiments which can use a lift-off technique.

The stress controlling substrate 102 can be formed over the thinned substrate 100. In particular, the stress controlling substrate 102 can be deposited over an exit surface of the thinned substrate 100. To this extent, the stress controlling substrate 102 can include an ultraviolet transparent substrate. In one embodiment, the ultraviolet stress controlling substrate 102 can include a piezoelectric material such as any of the aforementioned materials that can respond to an electric field by applying a mechanical stress to the optoelectronic device 80. In another embodiment, the ultraviolet stress controlling substrate 102 can include a Joule heating material such as any of the aforementioned materials that can respond to an applied current by imparting a thermal heating stress the optoelectronic device 80.

Figure 14:
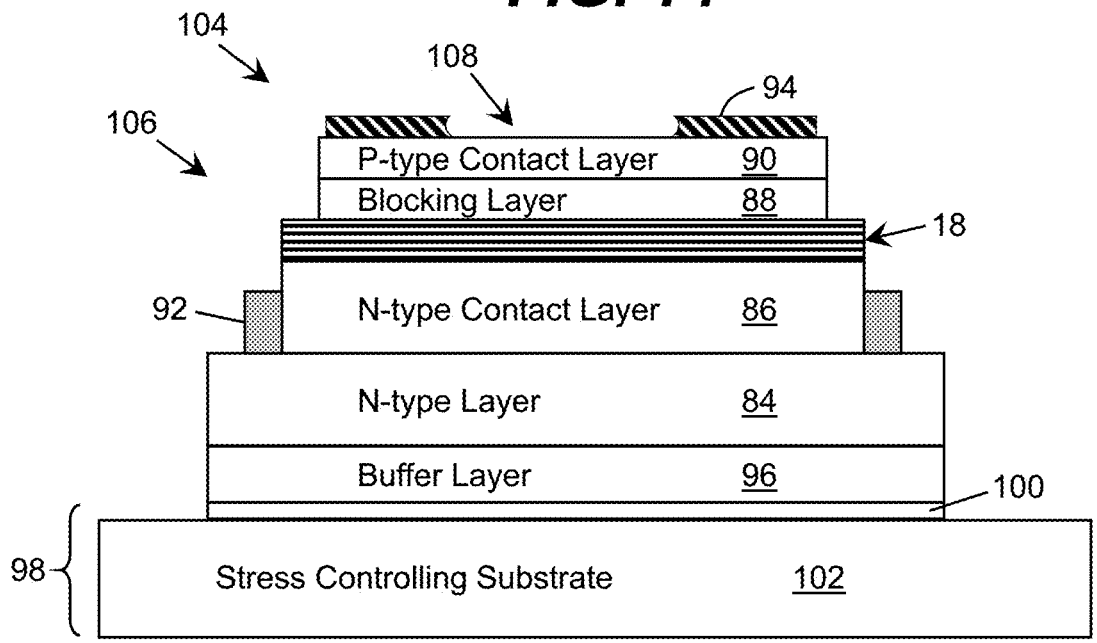
FIG. 14 shows a schematic of the optoelectronic device depicted in FIG. 13 with a window formed in a p-type electrode for facilitating testing of the device according to an embodiment.

It is understood that in some embodiments in which mesa-shaped semiconductor heterostructures are utilized, the stress controlling substrate can be formed from non-ultraviolet transparent materials (or materials not transparent to a target radiation of the optoelectronic device). For example, FIG. 14 shows a schematic of an optoelectronic device 104 with a semiconductor heterostructure 106 having a window 108 formed in the p-type metal electrode 94 in a scenario where the stress controlling substrate 102 is a non-ultraviolet transparent material (e.g., piezoelectric materials and Joule heating materials). The window 108 can be formed in the p-type metal electrode 94 using well-known techniques that include, but are not limited to, patterning and photolithography.

The window 108 of this embodiment can be used to facilitate the testing of the optoelectronic device 104. For example, the target radiation emitted (or absorbed) by the optoelectronic device 104 can be measured in the proximity of the window 108. For example, a peak wavelength change can be recorded as the radiation is emitted through the window 108. These measurements can be used to infer on the overall device performance over time. In particular, changes in the peak wavelength of the device can indicate changes of the stresses within semiconductor layers and a degree of relaxation of such semiconductor layers. In addition, the measurements can be used to assess the semiconductor layer stability of the layers in the semiconductor heterostructure 106 as a function of the applied stress that is exerted from the stress controlling substrate 102 to the device 104. In particular, a consistency in the peak wavelength (recording that the wavelength does not change with time) shows that the semiconductor layer are stable to applied stress and do not develop dislocations that can lead to semiconductor layer relaxation. While the measurements are described in conjunction with the optoelectronic device 104, it is understood that similar measurements can be made using any of the device embodiments described herein.

Figure 15:
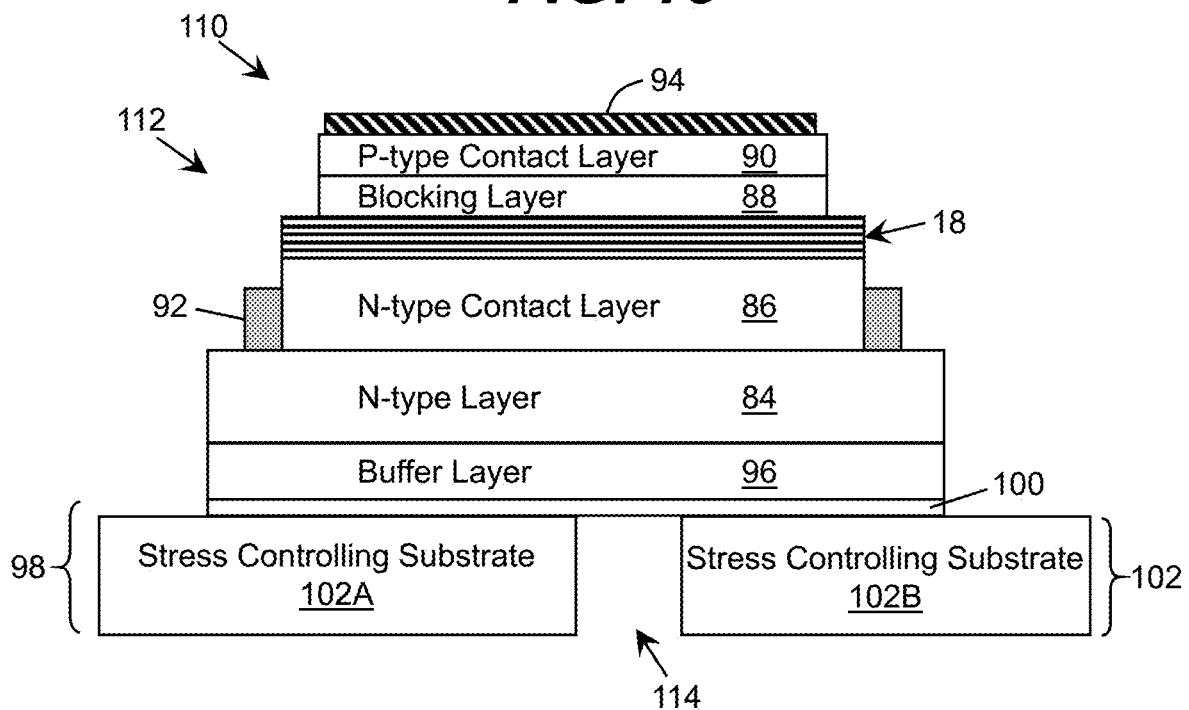
FIG. 15 shows a schematic of the optoelectronic device depicted in FIG. 13 with a window formed in the stress controlling substrate according to an embodiment.

FIG. 15 shows a schematic of an optoelectronic device 110 with a semiconductor heterostructure 112 that is similar to the heterostructure 82 depicted in FIG. 13, except in this embodiment the device 110 can include a set of windows 114 (e.g., channels) formed in the stress controlling substrate 102. In this embodiment, the window 114 can be formed within the stress controlling substrate 102 such that the substrate is separated into two or more segments (i.e., 102A and 102B). In this manner, the window 114 can be used to hold material that is to be analyzed using target radiation generated from the optoelectronic device 110. For example, material to be analyzed can be placed within the window 114 and can be sensed based on its absorbance and/or reflectance to a target radiation wavelength that is alterable through the action of the stress controlling substrate 102. This is beneficial in that the wavelength of radiation can be altered, which can be analyzed to determine a detailed absorption/reflectance spectra for the material being analyzed. In this example, only wavelengths that interact with the material in the window 114 can be used to isolate and determine the material in question.

It is understood that although the optoelectronic device 110 is shown in FIG. 15 with only one window 114, those skilled in the art will appreciate that the device can be configured with multiple windows. To this extent, the stress controlling substrate 102 could be separated into multiple segments, the number of which will be a function of the amount of windows 114 utilized. Also, in this embodiment, it is understood that the stress controlling substrate 102 can include an ultraviolet transparent stress controlling substrate having piezoelectric material or an ultraviolet absorbing material-based substrate also having piezoelectric material. In another embodiment, the stress controlling substrate can include an ultraviolet transparent or ultraviolet absorbing stress controlling substrate 102 with Joule heating material.

In another embodiment, the various optoelectronic devices and respective semiconductor heterostructures with at least one stress controlling layer can be tested for reliability using an accelerated stress test. Accelerated stress testing is a cornerstone for testing electronic equipment, as lifetime tests are typically time consuming and cannot adequately explore processes in real-time. Accelerated stress testing of optoelectronic devices such as LEDs and, in particular UV LEDs, can be done using a temperature test and/or a current test. The temperature test typically involves operating the optoelectronic device at an increased temperature and measuring the performance of the device as a function of time under such a thermal stress. The current test is typically performed by operating the optoelectronic device at an elevated current, while measuring a time dependent performance of the device. It is understood that without appropriate cooling, the current test can also lead to an increased temperature within the device. This results in the effects from both the current and temperature having an effect on the reliability of the optoelectronic device. In one embodiment, the current test can be performed while cooling the device to typical operational temperatures which effectively eliminates the heating of the optoelectronic device.

Accelerated stress testing of an optoelectronic device can also involve a photoluminescence test in which the device is radiated by a target wavelength that is typically at smaller wavelength than the operational wavelength of the device. The irradiation can be done by a high intensity laser which can result in temporal heating of the device. In contrast with a current test, it is not necessary to apply current to the device during a photoluminescence test. Typically, a photoluminescence test can measure the photoluminescence of a semiconductor layer in the semiconductor heterostructure after high intensity excitation by a laser beam. The amount of photoluminescence attests how the photoluminescence of the semiconductor layers has changed due to stresses on the device. In one embodiment, either photoluminescence or electroluminescence can be used to test the general device performance after the application of one of the thermal, current or photo stresses over the semiconductor heterostructure using the temperature test, the current test, or photoluminescence test, respectively.

An additional accelerated stress test of an optoelectronic device can involve applying periodic compressive and tensile stresses to the stress control layer which leads to the periodic compressive and tensile stresses within the semiconductor heterostructure. This is advantageous in that accelerated testing can quickly identify a quality of semiconductor layers and attest to possible failure mechanisms.

It is understood that any time dependence stress can be chosen for this accelerated stress testing modality. In this manner, the time dependent applied stress can comprise a series of stress impulses at high amplitude, a set of several longer low amplitude impulses, and/or a set of high frequency variations in stress within a semiconductor layer of the semiconductor heterostructure. In general, those skilled in the art will appreciate that a time dependent schedule for applying the stresses should be selected to approximate the typical stresses that are experienced during the lifetime of the device. For example, the stresses can be due to tensile stresses within the semiconductor layers of a device when the device is in the operational environment. For instance, the device can heat up during the operation resulting in thermal tensile stresses.

In addition, this stress test which involves applying periodic compressive and tensile stresses to the stress control layer can be combined with any other or all of the aforementioned tests, or with any other measurements that can be used to infer about the quality of the semiconductor layers in the semiconductor heterostructure. For example, in one embodiment, the stress test that involves applying periodic compressive and tensile stresses to the stress control layer can be combined with measurements of the photoluminescence of the device to evaluate device degradation as a function of time. For example, if the peak emission/absorption wavelength of the device changes after an applied stress, this is an indication of the changes within the device semiconductor layers. Similarly, if device performance (e.g., emission intensity) decreases after an applied stress, this is an indication of device degradation.

Those skilled in the art will appreciate that there are a number of possibilities for using any of the above accelerated stress test modalities with the various embodiments of optoelectronic devices described herein. For example, consider the optoelectronic device 40 of FIG. 2B with the semiconductor heterostructure 11 located on the stress controlling substrate 38. As noted previously, the semiconductor heterostructure 11 includes an n-type contact semiconductor layer 16, a p-type contact semiconductor layer 22, and an active layer 18 located between the n-type contact semiconductor layer and the p-type contact semiconductor layer that is configured to generate or sense radiation at a target peak wavelength. The optoelectronic device 40 further includes the stress inducing component 44 that is configured to induce a change in stress within the stress controlling substrate 38.

As depicted in FIG. 2B, the stress inducing component 44 can include the current source 46 to pass an electrical current through the stress controlling substrate 38 for inducing a thermal heating stress. The stress inducing component 44 can also include a voltage source coupled to a piezoelectric material based stress controlling substrate 38 that induces an electrical stress.

In one embodiment, an accelerated stress test of such an optoelectronic device can begin by applying a stress to the stress controlling substrate 38 with the stress inducing component 44. Next, a bias can be applied to the optoelectronic device 40 to turn on the device. The amount of stress and stress relaxation in the optoelectronic device 40 can be measured as the operation of the device shifts to the target peak wavelength. To this extent, the amount of stress and stress relaxation can be measured by analyzing the device wavelength. The measured stress and stress relaxation values can then be compared to nominal stress and stress relaxation values corresponding to, e.g., obtained previously from, a testing optoelectronic device operating without application of a stress to the stress controlling substrate. This comparison can be used to attest built in stress within the device.

In one embodiment, the aspect of applying a stress to the stress controlling substrate 38 with the stress inducing component 44 can include generating an electric signal in the substrate that produces a time-dependent stress (i.e., one of a compressive stress or a tensile stress) in a lateral direction. To this extent, the electric signal can create an electric field in the stress controlling substrate 38.

In one embodiment, the aspect of applying a stress to the stress controlling substrate 38 with the stress inducing component 44 can include passing an electric current into the substrate to produce heating therein. In this manner, the performance of the optoelectronic device 40 can be measured over the time that the device operates at the elevated current. In order to obviate the effects of an increased temperature that arises in the optoelectronic device due to the current, the passing of the current can be performed while cooling the device to a typical operational temperature or a predetermined temperature. In one embodiment, the electric current can be increased significantly (e.g., up to 100% and possibly more) while cooling the device to the appropriate operational temperatures. It is understood that cooling of the optoelectronic device 40 can occur prior to applying the bias to turn on the device.

In one embodiment, the measuring of the amount of stress and stress relaxation in the optoelectronic device 40 can include analyzing changes in the peak wavelength of the device and/or changes in a full width at half maxima (FWHM) of an emission generated from the device. Analyzing changes in the peak wavelength of the device and/or changes in a full width at half maxima (FWHM) of an emission is beneficial in that these changes are related to the stresses within a device, and based on observations of a shift in peak wavelength and changes in FWHM, the stresses within a device can be inferred.

It is understood that this method of an accelerated stress test of the optoelectronic device 40 depicted in FIG. 2B is illustrative of one approach and those skilled in the art will appreciate that other actions can be used in place of or in conjunction with those mentioned above. For example, electroluminescence or photoluminescence values can be measured and recorded from the optoelectronic device multiple times while operating under the applied stress over the lifetime of the device. Furthermore, it is understood that the other optoelectronic devices of the various embodiments described herein can undergo an accelerated stress test of a similar nature or one that involves different operations. For example, consider the optoelectronic device 104 depicted in FIG. 14 in which a window 108 is formed in the p-type metal electrode 94. An accelerated stress test of such a device can include measuring a target radiation emitted or absorbed by the optoelectronic device 104 in proximity to the window 108 formed in the p-type metallic contact layer 94. The measured radiation and the applied stress to the stress controlling substrate can be used to infer the performance of the optoelectronic device over time. In particular, observing wavelength of the target radiation allows inferences about the built in stresses in semiconductor layers. In addition, as noted above, the measurements can be used to assess the semiconductor layer stability of the layers in the semiconductor heterostructure 106 as a function of the applied stress that is exerted from the stress controlling substrate 102 to the device 104. The optoelectronic device 110 of FIG. 15 in which a window 114 is formed within the stress controlling substrate 102 is also suitable for use in an accelerated stress test scenario. As noted above, material placed within the window 114 can be analyzed and sensed based on its absorbance and/or reflectance to a target radiation wavelength that is alterable through the action of the stress controlling substrate 102.

Figure 16A:
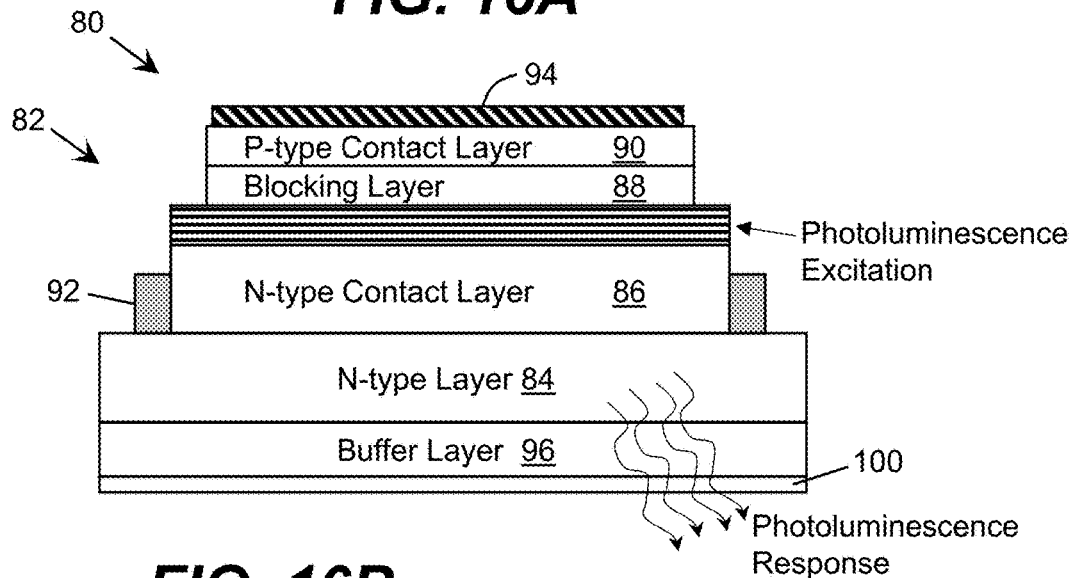
FIGS. 16A and 16B show an example of an optoelectronic device having a semiconductor heterostructure with a stress controlling layer that is subjected to a stress imparted through photoluminescence testing according to an embodiment.
Figure 16B:
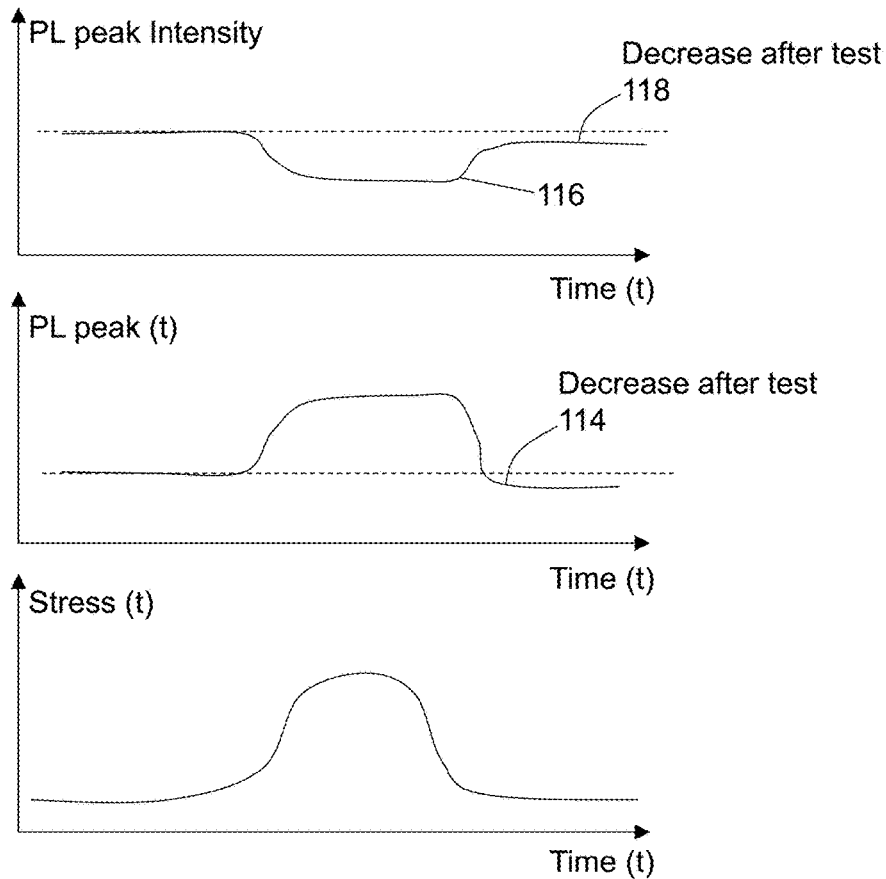

FIGS. 16A and 16B show an example of changes of photoluminescence when the stress impulse is applied to an optoelectronic device 80 and a semiconductor heterostructure 82 detailed in relation to FIG. 13. The peak wavelength is changed as shown by curve 114, and the peak emission can change as shown by curve 116. In particular, curve 114 shows that the peak wavelength is affected during and after an applied stress, while curve 116 shows that the peak intensity is affected during and after the time the stress has been applied. The curves may have long lasting changes even when the stress is turned off as shown by, for example, a change in the curve 116 at region 118. Such changes indicate a deterioration of the device 80 due to the changes in the semiconductor heterostructure 82.

In another embodiment, a method of performing an accelerated stress test of the optoelectronic device 40 depicted in FIG. 2B can entail applying an electric signal to the stress controlling substrate 38 that includes a time periodic stress signal. For example, a periodic stress signal can be applied to the stress controlling substrate 38 with the stress inducing component 44 to induce a stress in the optoelectronic device 40. The periodic stress signal can include one of a compressive stress and a tensile stress. In one embodiment, the applied periodic stress signal can comprise a series of stress impulses including a set of stress impulses having a high amplitude, a set of stress impulses having a low amplitude with a longer duration, and a set of stress impulses with high frequency variations in stress within the semiconductor heterostructure 11. As used herein, a high amplitude means a stress comparable to the stresses present within semiconductor layers during and after epitaxial growth over a substrate. In an embodiment, such stress can be as high as few tenths (e.g., 0.5) of GPA. A low amplitude means at most 50% and preferably 10% or less of the value of the high amplitude stress. Additionally, a longer duration means a duration of at least 200% or more of the shorter duration, where the shorter duration is measured in seconds (e.g., less than two minutes).

The optoelectronic device 40 can then be turned on and the amount of stress and stress relaxation can be measured in the optoelectronic device 40 as operation of the device shifts to the target peak wavelength. In addition, the measured stress and stress relaxation values can be compared to nominal stress and stress relaxation values for a nominal optoelectronic device that have been obtained while operating without any application of a periodic stress.

The accelerated stress test method for this embodiment can include other actions. For example, the optoelectronic device 40 can be irradiated with a target testing radiation while operating under the applied periodic stress. To this extent, photoluminescence or electroluminescence values can then be measured from the optoelectronic device 40. In one embodiment, an elevated electric current can be passed into the stress controlling substrate 38 to produce heating therein so that the performance of the device 40 can be measured over the time that the device operates with the elevated electric current. In another embodiment, the optoelectronic device 40 can be heated or cooled to a predetermined thermal stress temperature. The performance of the optoelectronic device 40 can then be measured during the time that the device operates at the predetermined thermal stress temperature. In one embodiment, the optoelectronic device 40 can be cooled for a predetermined time after applying the elevated current so that the performance of the device can be measured without being affected by the high temperatures that arise from the current.

Figure 17:
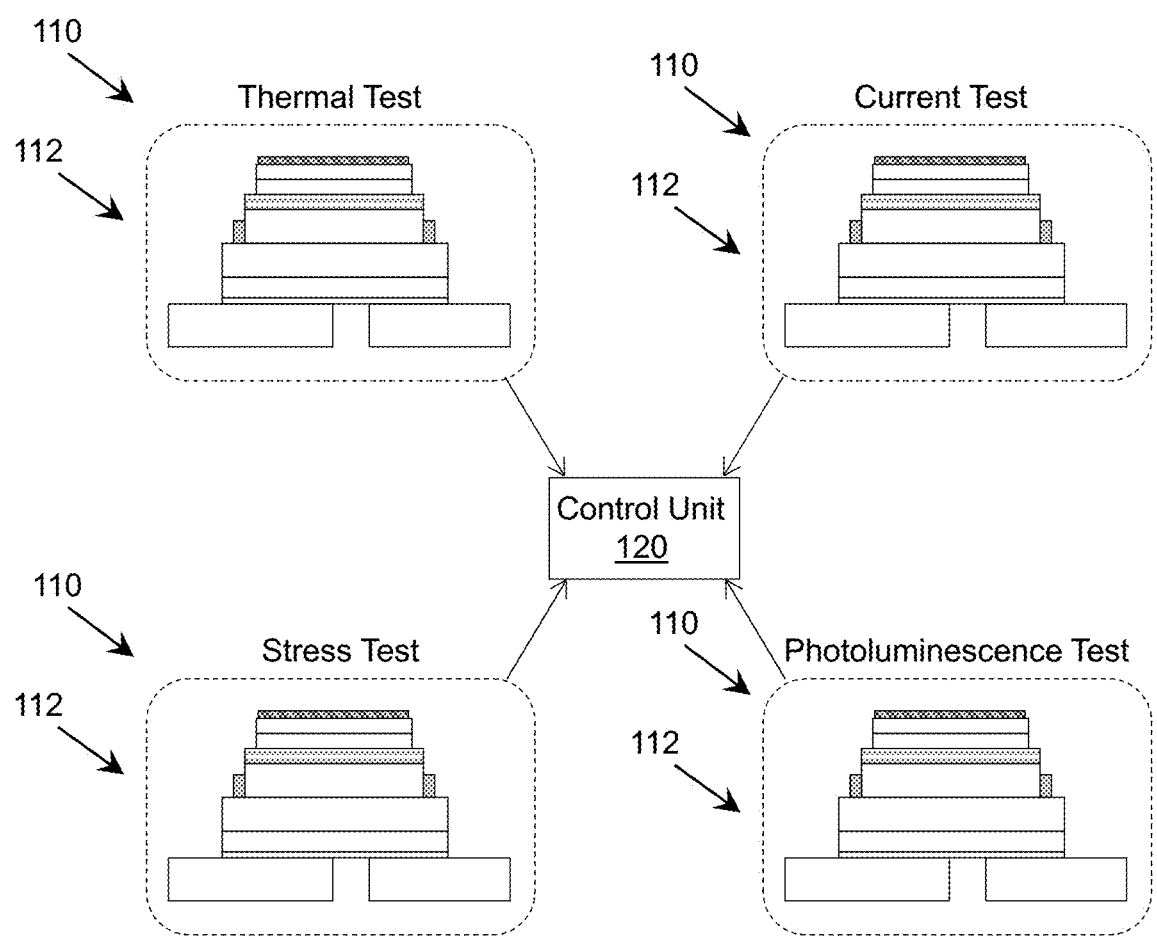
FIG. 17 shows a schematic of an optoelectronic device undergoing a complete accelerated test in which multiple tests including a thermal test, a current test, a stress test, and a photoluminescence test, are combined according to an embodiment.

In another embodiment, a combination of accelerated stress tests can be used to test the optoelectronic device 40. FIG. 17 shows a schematic of the optoelectronic device 110 (reference elements omitted for clarity) detailed with regard to FIG. 15 undergoing a complete accelerated stress test in which results from multiple tests including a thermal test, a current test, a stress test, and a photoluminescence test are combined in control unit 120 to yield a more complete accelerated test for the device. In this embodiment, the thermal test, the current test, the stress test, and the photoluminescence test can be applied in addition to the aforementioned stress test and application of a periodic stress test to the stress controlling substrate 38 of the semiconductor heterostructure.

For example, the optoelectronic device 110 can be irradiated with a target testing radiation while operating under the applied periodic stress. In this manner, photoluminescence or electroluminescence values can be measured from the irradiated optoelectronic device 110. The optoelectronic device 110 can also be heated or cooled to a predetermined thermal stress temperature so that the performance of the device can be measured as a function of time that the device operates at the predetermined thermal stress temperature. Next, an elevated electric current can be passed into the stress controlling substrate 38 to produce heating. The performance of the optoelectronic device 110 can then be measured over the time that the device operates with the elevated electric current. The optoelectronic device 110 can then be radiated again with the target testing radiation after applying the periodic stress to the stress controlling substrate, the irradiating of the optoelectronic device, the heating or cooling of the optoelectronic device, and the passing of the elevated electric current into the stress controlling substrate 38. The photoluminescence or electroluminescence values from the optoelectronic device 110 can then be measured. The photoluminescence or electroluminescence values from the optoelectronic device 110 can provide an indication of degradation of the device when the device undergoes accelerated testing. In an embodiment degradation of the device can be seen as a decrease in emission intensity of the device.

In this manner, results from all of the various accelerated stress tests can be provided to the control unit 120 using well-known data acquisition techniques using detectors, sensors, and the like to obtain data during each of the tests. In one embodiment, the control unit 120 can infer a quality measurement of the semiconductor heterostructure of the device from the measured photoluminescence or electroluminescence values obtained from the optoelectronic device. In particular, the control unit 120 infers the quality measurement by evaluating the emission intensity of the device. Other types of analytics that the control unit 120 can extract from the results of the tests that pertain to the performance and reliability of the optoelectronic device and the semiconductor heterostructure include, but are not limited to, a shift in wavelength of the light emission, the device response time to a time varied bias, the device temperature, and the distribution of the emitted light when evaluated over the exit surface of the device. For instance, an increased operating temperature may imply degradation of the device. Similarly, a non-uniform emission from the surface of the device can imply degradation at certain regions within the device.

An accelerated stress test in which multiple tests including a thermal test, a current test, a stress test, and a photoluminescence test are combined in the aforementioned manner yields a more complete accelerated test for the device since it evaluates various possible degradation mechanisms.

In addition to making the above determinations, the control unit 120 can be used to control the operation of each of the accelerated stress tests including the control of the components (e.g., sensors, detectors and the like) to obtain the data from the optoelectronic device that is subjected to the multiple tests. Details of the general architecture of the control unit 120 which is applicable to implementing this embodiment as well as others described herein are described below with regard to FIG. 19. Furthermore, it is understood that this embodiment is applicable to any of the other optoelectronic devices described herein and is not meant to be limited to the optoelectronic device 110 and the semiconductor heterostructure 112 as depicted in FIG. 17.

Figure 18:
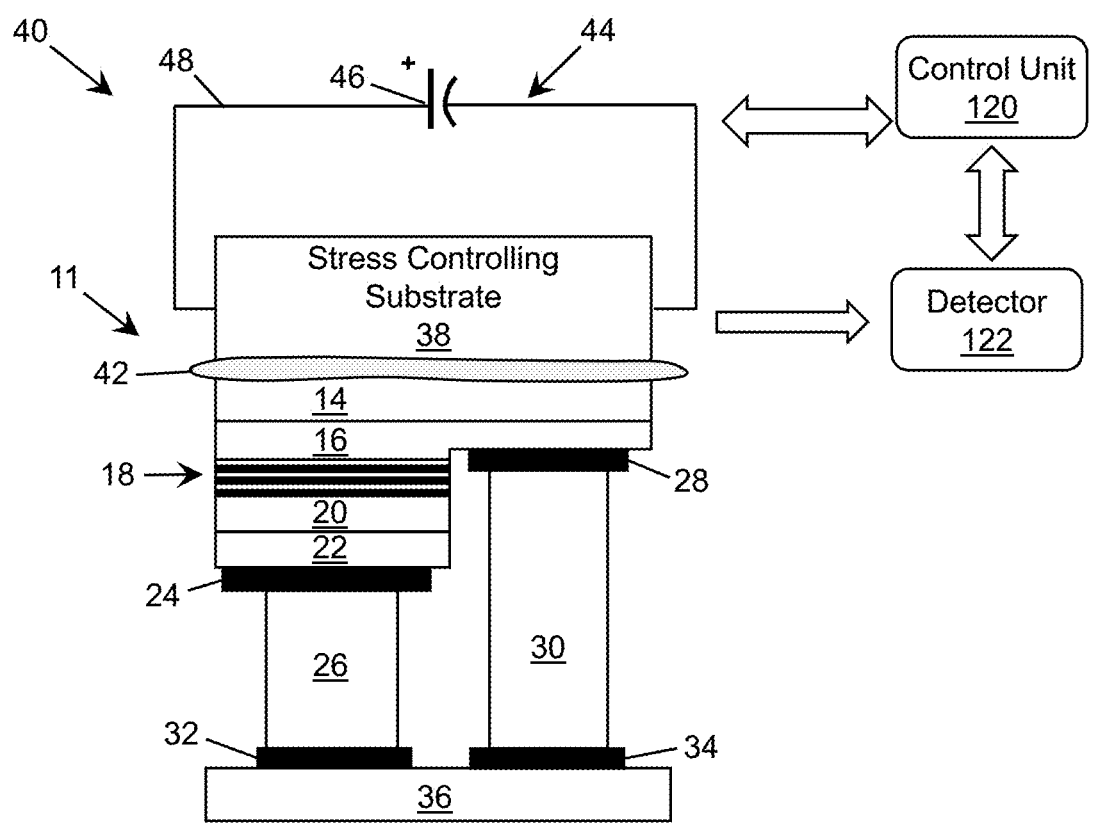
FIG. 18 shows a schematic of a control unit and detector operating in conjunction with an optoelectronic device like the one depicted in FIG. 2B to evaluate a target strain generated within the semiconductor heterostructure according to an embodiment.

Also, it is understood that the control unit 120 can be used in other capacities besides as an evaluator in a multi-accelerated test environment. FIG. 18 shows a schematic of the control unit 120 operating in conjunction with the optoelectronic device 40 depicted in FIG. 2B as a strain evaluator to evaluate a target strain generated within the semiconductor heterostructure 11. It is understood that this embodiment is applicable to any of the optoelectronic devices of the various embodiments described herein, as well as any other devices that employ at least one stress controlling layer that is commensurate in scope with the teachings of the embodiments.

In one embodiment, the stress inducing component 44 can generate a target strain in the stress controlling substrate 38. For example, the stress inducing component 44 can create an electric field that causes the piezoelectric material of the stress controlling substrate 38 to exert a target strain or stress in the substrate. In one embodiment, the stress inducing component 44 can control the target strain in a lateral direction and/or a vertical direction within the stress controlling substrate 38.

A strain detector 122 can be operatively coupled to the optoelectronic device 40 and the control unit 120 to measure the strain within the semiconductor heterostructure 11. The strain detector 122 can include, but is not limited to, a piezo-electric strain sensor, an optical sensor, and/or the like. It is understood that other detectors can be used to obtain data regarding the performance, quality and reliability of the optoelectronic device 40 and the semiconductor heterostructure 11 including, but not limited to, optoelectronic sensors capable of detecting changes of radiation emitted from the device.

In one embodiment, the stress inducing component 44 can generate a target strain that is selected to minimize a target functional based on stresses within the semiconductor heterostructure. As used herein, a target functional means overall degradation of the device. The strain detector 122 can measure the device degradation based on the generated stresses within the semiconductor heterostructure 11 over the lateral and/or the vertical directions. In one embodiment, the strain detector 122 can include an optical detector that detects photoluminescence or electroluminescence in the heterostructure 11 to measure device degradation. To this extent, the strain detector 122 can generate signals representative of the measured target functional for feedback to the control unit 120.

In one embodiment, the control unit 120 can evaluate the target strain within the semiconductor heterostructure 11 based on numerical simulation or analytical calculations. In particular, the strain can be modeled within a semiconductor heterostructure once the type of semiconductor layers and their thicknesses are known, combined with the knowledge of the applied control stress and assumptions of relaxation of semiconductor layers.

Figure 19:
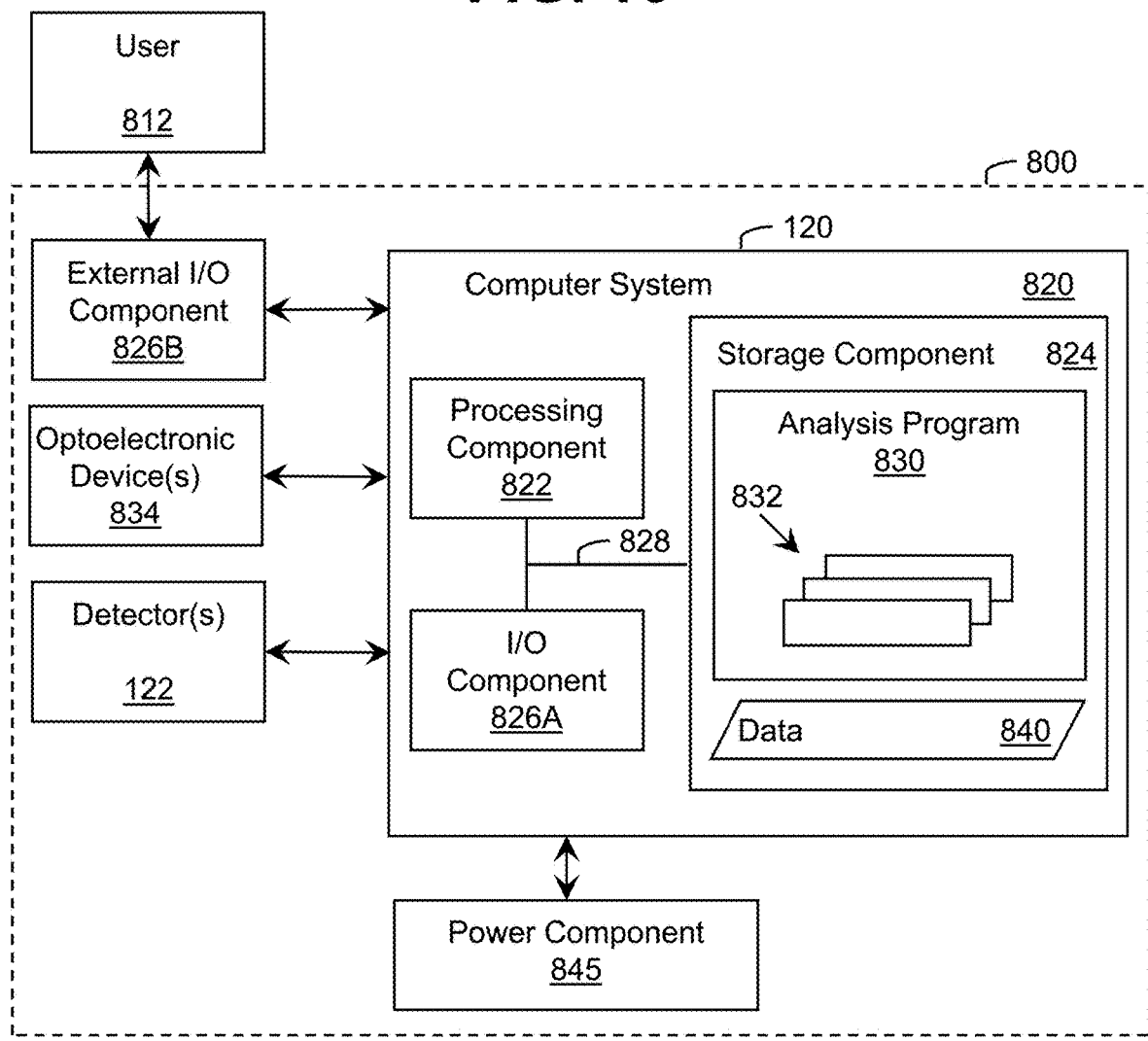
FIG. 19 shows a schematic block diagram representative of an overall processing architecture of a control unit that is applicable for use as a strain evaluator with any of the optoelectronic devices described herein according to an embodiment.

FIG. 19 shows a schematic block diagram representative of an overall processing architecture of a system 800 that is applicable for use as a strain evaluator with any of the optoelectronic devices described herein according to an embodiment. In this embodiment, the architecture 800 is shown including detector(s) 122 and optoelectronic device(s) 834 for the purposes of illustrating their interaction with some of the components of the control unit 120 for evaluating a strain within a semiconductor heterostructure of the optoelectronic device(s).

As depicted in FIG. 19, the control unit 120 can be implemented as a computer system 820 including an analysis program 830, which makes the computer system 820 operable to manage the detector(s) 122 and any other of the components that can be used in the manner described herein. In particular, the analysis program 830 can enable the computer system 820 to operate the components in an aforementioned manner and process data corresponding to one or more attributes regarding the components, which the computer system 820 can store as device data 840. The computer system 820 can individually control each component and/or control two or more of the components as a group.

In an embodiment, during an initial period of operation, the computer system 820 can acquire data from at least one of the components regarding one or more attributes and generate data 840 for further processing. The computer system 820 can use the data 840 to control one or more aspects of the components.

Furthermore, one or more aspects of the operation of the components can be controlled or adjusted by a user 812 via an external interface I/O component 826B. The external interface I/O component 826B can include, for example, a touch screen that can selectively display user interface controls, such as control dials, which can enable the user 812 to adjust one or more properties of the operation of the optoelectronic device(s) 834 and the detector(s) 122. In an embodiment, the external interface I/O component 826B could conceivably include a keyboard, a plurality of buttons, a joystick-like control mechanism, and/or the like, which can enable the user 812 to control one or more aspects of the operation of the optoelectronic device(s) 834 and the detector(s) 122. The external interface I/O component 826B also can include any combination of various output devices (e.g., an LED, a visual display), which can be operated by the computer system 820 to provide status information pertaining to the optoelectronic device(s) 834 and the detector(s) 122 for use by the user 812. For example, the external interface I/O component 826B can include one or more LEDs for emitting a visual light for the user 812. In an embodiment, the external interface I/O component 826B can include a speaker for providing an alarm (e.g., an auditory signal). In another embodiment, the external I/O component 826B can include one or more communications devices for communicating with a system user 812 using any combination of one or more types of communications solutions.

The computer system 820 is shown including a processing component 822 (e.g., one or more processors), a storage component 824 (e.g., a storage hierarchy), an input/output (I/O) component 826A (e.g., one or more I/O interfaces and/or devices), and a communications pathway 828. In general, the processing component 822 executes program code, such as the analysis program 830, which is at least partially fixed in the storage component 824. While executing program code, the processing component 822 can process data, which can result in reading and/or writing transformed data from/to the storage component 824 and/or the I/O component 826A for further processing. The pathway 828 provides a communications link between each of the components in the computer system 820. The I/O component 826A and/or the external interface I/O component 826B can comprise one or more human I/O devices, which enable a human user 812 to interact with the computer system 820 and/or one or more communications devices to enable a system user 812 to communicate with the computer system 820 using any type of communications link. To this extent, during execution by the computer system 820, the analysis program 830 can manage a set of interfaces (e.g., graphical user interface(s), application program interface, and/or the like) that enable human and/or system users 812 to interact with the analysis program 830. Furthermore, the computer system 820 can manage (e.g., store, retrieve, create, manipulate, organize, present, etc.) the data, such as data 840, using any solution.

In any event, the computer system 820 can comprise one or more general purpose computing articles of manufacture (e.g., computing devices) capable of executing program code, such as the analysis program 830, installed thereon. As used herein, it is understood that "program code" means any collection of instructions, in any language, code or notation, that cause a computing device having an information processing capability to perform a particular function either directly or after any combination of the following: (a) conversion to another language, code or notation; (b) reproduction in a different material form; and/or (c) decompression. To this extent, the analysis program 830 can be embodied as any combination of system software and/or application software.

Furthermore, the analysis program 830 can be implemented using a set of modules 832. In this case, a module 832 can enable the computer system 820 to perform a set of tasks used by the analysis program 830, and can be separately developed and/or implemented apart from other portions of the analysis program 830. When the computer system 820 comprises multiple computing devices, each computing device can have only a portion of the analysis program 830 fixed thereon (e.g., one or more modules 832). However, it is understood that the computer system 820 and the analysis program 830 are only representative of various possible equivalent monitoring and/or control systems that may perform a process described herein with regard to the control unit 120 and the detectors. To this extent, in other embodiments, the functionality provided by the computer system 820 and the analysis program 830 can be at least partially be implemented by one or more computing devices that include any combination of general and/or specific purpose hardware with or without program code. In each embodiment, the hardware and program code, if included, can be created using standard engineering and programming techniques, respectively. In another embodiment, the control unit 120 can be implemented without any computing device, e.g., using a closed loop circuit implementing a feedback control loop in which the outputs of one or more detectors/sensors are used as inputs to control the operation of the optoelectronic device(s) 834 for testing thereof. Illustrative aspects of the invention are further described in conjunction with the computer system 820. However, it is understood that the functionality described in conjunction therewith can be implemented by any type of monitoring and/or control system.

Regardless, when the computer system 820 includes multiple computing devices, the computing devices can communicate over any type of communications link. Furthermore, while performing a process described herein, the computer system 820 can communicate with one or more other computer systems, such as the user 812, using any type of communications link. In either case, the communications link can comprise any combination of various types of wired and/or wireless links; comprise any combination of one or more types of networks; and/or utilize any combination of various types of transmission techniques and protocols.

All of the components depicted in FIG. 19 can receive power from a power component 845. The power component 845 can take the form of one or more batteries, a vibration power generator that can generate power based on magnetic inducted oscillations or stresses developed on a piezoelectric crystal, a wall plug for accessing electrical power supplied from a grid, and/or the like. In an embodiment, the power source can include a super capacitor that is rechargeable. Other power components that are suitable for use as the power component 845 can include solar, a mechanical energy to electrical energy converter such as a piezoelectric crystal, a rechargeable device, etc.

Figure 20:
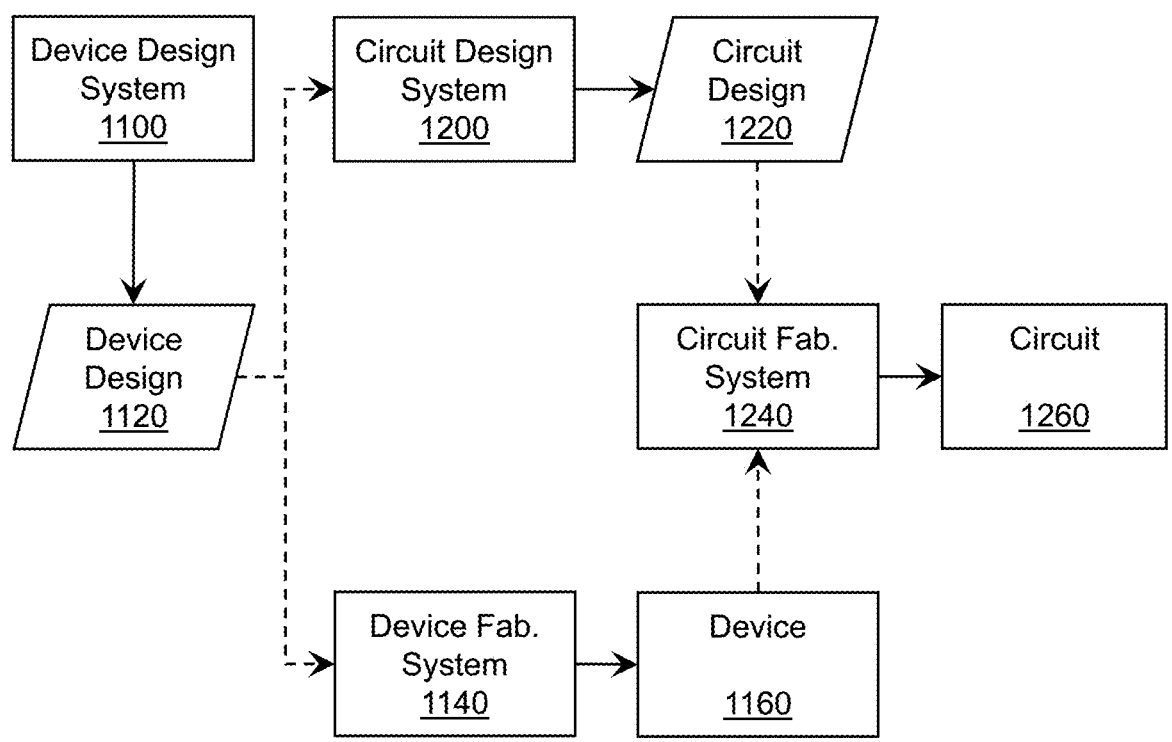
FIG. 20 shows an illustrative flow diagram for fabricating an optoelectronic device and semiconductor heterostructure having at least one stress controlling layer according to one of the various embodiments described herein.

In one embodiment, the invention provides a method of designing and/or fabricating a circuit that includes one or more of the optoelectronic devices and semiconductor heterostructures having at least one stress controlling layer designed and fabricated as described herein. To this extent, FIG. 20 shows an illustrative flow diagram for fabricating a circuit 1260 according to an embodiment. Initially, a user can utilize a device design system 1100 to generate a device design 1120 for an optoelectronic semiconductor device as described herein. The device design 1120 can comprise program code, which can be used by a device fabrication system 1140 to generate a set of physical devices 1160 according to the features defined by the device design 1120. Similarly, the device design 1120 can be provided to a circuit design system 1200 (e.g., as an available component for use in circuits), which a user can utilize to generate a circuit design 1220 (e.g., by connecting one or more inputs and outputs to various devices included in a circuit). The circuit design 1220 can comprise program code that includes a device designed as described herein. In any event, the circuit design 1220 and/or one or more physical devices 1160 can be provided to a circuit fabrication system 1240, which can generate a physical circuit 1260 according to the circuit design 1220. The physical circuit 1260 can include one or more devices 1160 designed as described herein.

In another embodiment, the invention provides a device design system 1100 for designing and/or a device fabrication system 1140 for fabricating a semiconductor device 1160 as described herein. In this case, the system 1100, 1140 can comprise a general purpose computing device, which is programmed to implement a method of designing and/or fabricating the semiconductor device 1160 as described herein. Similarly, an embodiment of the invention provides a circuit design system 1200 for designing and/or a circuit fabrication system 1240 for fabricating a circuit 1260 that includes at least one device 1160 designed and/or fabricated as described herein. In this case, the system 1200, 1240 can comprise a general purpose computing device, which is programmed to implement a method of designing and/or fabricating the circuit 1260 including at least one semiconductor device 1160 as described herein. In either case, the corresponding fabrication system 1140, 1240, can include a robotic arm and/or electromagnet, which can be utilized as part of the fabrication process as described herein.

In still another embodiment, the invention provides a computer program fixed in at least one computer-readable medium, which when executed, enables a computer system to implement a method of designing and/or fabricating a semiconductor device as described herein. For example, the computer program can enable the device design system 1100 to generate the device design 1120 as described herein. To this extent, the computer-readable medium includes program code, which implements some or all of a process described herein when executed by the computer system. It is understood that the term "computer-readable medium" comprises one or more of any type of tangible medium of expression, now known or later developed, from which a stored copy of the program code can be perceived, reproduced, or otherwise communicated by a computing device.

In another embodiment, the invention provides a method of providing a copy of program code, which implements some or all of a process described herein when executed by a computer system. In this case, a computer system can process a copy of the program code to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a device design system 1100 for designing and/or a device fabrication system 1140 for fabricating an optoelectronic semiconductor device as described herein. In this case, a computer system can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; and/or the like.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. An optoelectronic device, comprising:
 a stress controlling structure including one of: a piezoelectric material or a joule heating material;
 a semiconductor heterostructure located adjacent to the stress controlling structure, the semiconductor heterostructure including an n-type contact semiconductor layer, a p-type contact semiconductor layer, and an active layer located between the n-type contact semiconductor layer and the p-type contact semiconductor layer that is configured to generate or sense radiation at a target peak wavelength; and
 a stress inducing component that is configured to selectively induce a change in stress within the stress controlling structure.

2. The optoelectronic device of claim 1, further comprising:
 an n-type metallic contact formed over a portion of the n-type contact semiconductor layer;
 a p-type metallic contact formed over a portion of the p-type contact semiconductor layer;
 an n-type electrode contacting the n-type metallic contact; and
 a p-type electrode contacting the p-type metallic contact.

3. The optoelectronic device of claim 2, wherein the stress controlling structure is formed over at least one of: the n-type contact semiconductor layer or the p-type contact semiconductor layer, the stress controlling structure extending into vacancies formed in the at least one of: the n-type metallic contact or the p-type metallic contact, to contact at least one of: the n-type electrode or the p-type electrode.

4. The optoelectronic device of claim 1, further comprising a buffer layer and a substrate located on the semiconductor heterostructure, wherein the stress controlling structure is located between the substrate and the buffer layer, wherein the stress controlling structure comprises a plurality of disjointed domains extending laterally across the buffer layer, each of the disjointed domains of the stress controlling structure separated from an adjacent disjointed domain by a portion of the buffer layer.

5. The optoelectronic device of claim 1, wherein the stress controlling structure comprises a piezoelectric material.

6. The optoelectronic device of claim 1, wherein the stress controlling structure comprises a plurality of domains, each of the domains having piezoelectric properties.

7. The optoelectronic device of claim 1, further comprising a plurality of composite domains located with the stress controlling structure, wherein the plurality of composite domains have temperature activated materials that are configured for Joule heating, each of the composite domains having a coefficient of thermal expansion that is higher than a coefficient of thermal expansion of the stress controlling structure.

8. The optoelectronic device of claim 1, wherein the stress controlling structure comprises a stress controlling substrate having interdigitated electrodes operatively coupled with the stress inducing component, wherein the change in stress induced in the stress controlling substrate by the stress inducing component is a function of location, position, separation and orientation of the electrodes that form the set of interdigitated electrodes.

9. The optoelectronic device of claim 1, wherein the stress controlling structure confines the semiconductor heterostructure and a substrate formed with the heterostructure on at least four sides, wherein the stress controlling structure exerts a mechanical stress on the semiconductor heterostructure and the substrate in a vertical direction.

10. The optoelectronic device of claim 1, wherein the stress controlling structure confines a portion of the semiconductor heterostructure and all of a substrate formed with the heterostructure on at least two sides, wherein the stress controlling structure exerts a mechanical stress on the substrate and the semiconductor heterostructure in a lateral direction.

11. The optoelectronic device of claim 1, wherein the stress controlling structure comprises a stress controlling substrate, and further comprising a thinned substrate layer formed between the stress controlling substrate and the semiconductor heterostructure.

12. An optoelectronic device, comprising:
 a semiconductor heterostructure including an n-type contact semiconductor layer, a p-type contact semiconductor layer, and an active layer located between the n-type contact semiconductor layer and the p-type contact semiconductor layer that is configured to generate or sense radiation at a target peak wavelength;
 a stress controlling structure including one of: a piezoelectric material or a joule heating material located adjacent to the semiconductor heterostructure that distributes stresses to the semiconductor heterostructure, wherein the stress controlling structure includes interdigitated electrodes; and
 a stress inducing component that is configured to selectively induce a stress in the stress controlling structure via the interdigitated electrodes.

13. The optoelectronic device of claim 12, wherein the stress induced in the stress controlling substrate by the stress inducing component is a function of location, position, separation and orientation of the electrodes that form the interdigitated electrodes.

14. The optoelectronic device of claim 12, wherein the interdigitated electrodes are configured to produce a uniform or non-uniform distribution of stresses in a lateral direction of the stress controlling structure.

15. The optoelectronic device of claim 12, wherein the interdigitated electrodes include sets of interdigitated electrodes, each set located on a bottom surface of the stress controlling structure.

16. The optoelectronic device of claim 15, wherein the stress inducing component is configured to synchronously activate the sets of interdigitated electrodes to produce a stress wave that propagates through the stress controlling structure.

17. The optoelectronic device of claim 16, wherein the stress inducing component delivers a time dependent voltage on the sets of interdigitated electrodes.

18. An optoelectronic device, comprising:
 a semiconductor heterostructure including an n-type contact semiconductor layer, a p-type contact semiconductor layer, and an active layer located between the n-type contact semiconductor layer and the p-type contact semiconductor layer that is configured to generate or sense radiation at a target peak wavelength;
 a stress controlling structure adjacent to the semiconductor heterostructure, the stress controlling structure having a plurality of domains including at least one of: piezoelectric material or joule heating material; and
 a stress inducing component that is configured to selectively induce a change in stress within the stress controlling structure.

19. The optoelectronic device of claim 18, wherein the stress controlling structure comprises interdigitated electrodes operatively coupled with the stress inducing component, wherein the change in stress induced in the stress controlling structure by the stress inducing component is a function of location, position, separation and orientation of the electrodes that form the set of interdigitated electrodes.

20. The optoelectronic device of claim 19, wherein the interdigitated electrodes include sets of interdigitated electrodes, wherein the stress inducing component is configured to synchronously activate the sets of interdigitated electrodes to produce a stress wave that propagates through the stress controlling structure, wherein the stress wave that propagates through the stress controlling structure translates into tensile and compressive stresses within layers that form the semiconductor heterostructure.

\* \* \* \* \*